United States Patent
Borchert et al.

(10) Patent No.: US 6,822,457 B2
(45) Date of Patent: Nov. 23, 2004

(54) METHOD OF PRECISELY DETERMINING THE LOCATION OF A FAULT ON AN ELECTRICAL TRANSMISSION SYSTEM

(76) Inventors: Marshall B. Borchert, 4239 Calvert Pl., Lincoln, NE (US) 68506; Douglas A. Hartzell, 2825 N. 65th St., Lincoln, NE (US) 68507

( * ) Notice: Subject to any disclaimer, the term of this patent is extended or adjusted under 35 U.S.C. 154(b) by 0 days.

(21) Appl. No.: 10/672,576

(22) Filed: Sep. 29, 2003

(65) Prior Publication Data

US 2004/0189317 A1 Sep. 30, 2004

Related U.S. Application Data

(60) Provisional application No. 60/458,080, filed on Mar. 27, 2003.

(51) Int. Cl.[7] .................... G01R 31/08; G01R 31/00; H02H 3/50
(52) U.S. Cl. .................... 324/512; 324/527; 324/532; 702/59; 361/81
(58) Field of Search ................. 324/512, 527, 324/532, 535, 522, 523, 637, 639; 361/80, 81; 702/58, 59

(56) References Cited

U.S. PATENT DOCUMENTS

| | | | |
|---|---|---|---|
| 2,493,800 A | 1/1950 | Bisheborn | 324/532 |
| 2,717,922 A | 9/1955 | Weintraub | 324/512 |
| 3,462,681 A | 8/1969 | Biskup | 324/52 |
| 3,586,968 A * | 6/1971 | Barjot et al. | 324/523 |
| 3,609,533 A | 9/1971 | Pardis | 324/52 |
| 3,729,654 A * | 4/1973 | Yeager | 361/68 |
| 4,491,782 A | 1/1985 | Bellis et al. | 324/52 |
| 4,499,417 A | 2/1985 | Wright et al. | 324/52 |
| 4,570,231 A | 2/1986 | Bunch | 364/492 |
| 5,243,294 A | 9/1993 | Burnett | 324/535 |
| 5,382,910 A | 1/1995 | Walsh | 324/553 |
| 5,416,418 A | 5/1995 | Maureira et al. | 324/535 |
| 5,514,965 A | 5/1996 | Westwood | 324/533 |
| RE35,561 E | 7/1997 | Mashikian et al. | 324/520 |
| 5,751,149 A | 5/1998 | Oberg et al. | 324/533 |
| 5,903,155 A | 5/1999 | Bjorklund | 324/522 |
| 6,177,801 B1 * | 1/2001 | Chong | 324/520 |

* cited by examiner

*Primary Examiner*—Anjan K. Deb
(74) *Attorney, Agent, or Firm*—James D. Welch

(57) ABSTRACT

A method of precisely determining velocity of propagation and the location of a fault on an electric transmission line, using a system of high frequency transmitter and receiver combinations to monitor and detect high frequency bursts produced by the transmitters and by faults, including memory and analysis capability to store and analyze high frequency data before and after a detected fault.

28 Claims, 9 Drawing Sheets

METHOD OF PRECISELY DETERMINING THE LOCATION OF A FAULT ON AN ELECTRICAL TRANSMISSION SYSTEM

This application claims the benefit of Provisional Application No. 60/458,080 filed Mar. 27, 2003.

TECHNICAL FIELD

The disclosed invention relates to a method and system for identifying faults on an electrical transmission system, and more particularly to a method of precisely determining the location of a fault on an electric transmission line by detecting and monitoring high frequency bursts produced by faults and also using a system of high frequency transmitter and receiver combinations to monitor and detect high frequency bursts produced by the transmitters, said system including memory to store high frequency data before and after a detected fault, and algorithm capability to analyze said stored data.

BACKGROUND

A common occurrence in the power distribution industry is an arcing or electrical discharge in the transmission and distribution grid system. Such faults commonly are caused by such as insulation breakdown, physical damage to the transmission line, moisture ingress etc., or a combination thereof, and it is noted, characteristics of an arcing or discharge fault vary widely. For instance, a fault may manifest as a relatively high impedance transient event which lasts for only microseconds, or as a low impedance sustained fault that eventually leads to rupture of network protection devices, (eg. a fuse or circuit breaker or the operation of a circuit breaking relay).

It is to be understood that even minor occurrences of transient discharge in cables can eventually lead to more catastrophic problems because successive discharge events degrade the quality of the cable. Early detection and location of transient fault events, leading to their correction, can therefore result in economic benefits such as increased overall network quality and customer satisfaction because of reduced outages.

Important to the presently disclosed invention is that a consistent characteristic of an arcing or discharge fault event is, at the time of discharge, the generation of a burst of electrical energy or noise which comprises high frequency components. And, it is also important to understand that voltage and/or current waveforms generated by the arcing or discharge fault event travel away from the fault site in both directions in the transmission system. This phenomenon has been disclosed in a number of patents. For instance Biskeborn, U.S. Pat. No. 2,493,800, 1950, Weintraub, U.S. Pat. No. 2,717,992, 1955, Biskip, U.S. Pat. No. 3,462,681, 1969, disclose fault location systems that:

Detect the electrical wave associated with a discharge, partial discharge, arcing fault or lightning strike that travels to each end of the cable or transmission system from the fault point.

Collect time data associated with the traveling wave caused by the fault or event passing a sensor or coupling point at each end of the transmission system.

Calculate distance to fault by centrally processing the time delay data via an RP communications link, or some other data transmission link.

Said Patents describe systems for application to high voltage overhead transmission lines, and assume a velocity of propagation of the traveling wave.

The Biskeborn 800 Patent describes an application to shorter cable lengths, but requires access to each end of the cable at a common point.

The Pardis, U.S. Pat. No. 3,609,533, 1971, describes a fault location system which utilizes a high energy pulse transmitted on the network under test to provide a reference for time and/or delay measurements to determine distance to fault, (rather than use of an RP link or other transmission media). The 533 Patent generally:

Is applied to high voltage overhead transmission lines;

Is designed for massive insulation breakdown or lightning strike, and provides 500 to 1,000 feet of accuracy; and Assumes velocity of propagation of the traveling wave.

A Patent to Maureira, U.S. Pat. No. 5,416,418, 1995, describes application in lover voltage, (ie. 6 kV to 33 kV), distribution cables, and focuses on partial discharge events using a pulse transmission technique as a reference/timing signal. The general characteristics of the Maureira invention are:

It is designed for application on shorter power distribution networks than is the Pardis 533 Patent system;

It detects much smaller partial discharge or corona discharge faults, (partial discharge faults are periodic, non-catastrophic corona discharge events), that don't necessarily trip circuit breakers or destroy the cable, but do degrade the cable over time;

It requires the cable to be isolated from the distribution network;

It requires a high voltage source to stress the cable into partial discharge activity; and It assumes velocity of propagation or uses a VOP established during test setup.

Considering previous disclosures and the economic benefit associated with locating faults in a proactive manner, it is apparent that clear commercial advantage can result from application of new technology which provides low cost, accurate fault location methods and apparatus, thereby providing improvement over previously disclosed systems. Characteristics of such a method and apparatus, as disclosed in this Specification include:

It monitors and stores the established phenomenon of a traveling wave emanating from an arcing or discharge fault in the time domain, It co-ordinates the monitoring invention(s) in a manner that allows ratio-metric time to distance calculations versus a known distance between the monitoring systems based on traveling wave time delay measurements and initiating signals, It improves upon Biskeborn, Weintraub, Biskip, and Pardis, by providing more accurate, higher resolution timing measurements, which, in turn, increase the accuracy of distance to fault calculations, It improves upon Maureira by allowing the transmission system to remain In service for fault locating, Unlike the Maureira 418 Patent system, there is no requirement that an external, (other than that intrinsic to the distribution system), high voltage be applied to sufficiently stress the transmission system to cause discharge.

A Patent to Bjorklund, 5,903,155 describes the same fundamental process that Biskeborn, Weintraub, Biskip, Pardis and Maureira use, namely:

Detecting the traveling wave produced by a fault by at least two receivers on each end of the transmission system;

Synchronize the timing of the traveling wave reception via some method so distance to fault calculations can be made.

The specific claims of the Bjorklund patent are:

It specifies High Voltage DC transmission system in the claims;

It uses synchronous clocks at each receiver; and

It detects current associated with the traveling wave using a DC transformer and a Rogovski (AC) coil. Previous patents also detect the current.

A Patent to Wright et al 4,499,417 describes a single ended system that uses the disturbance created by the fault and subsequent reflections. In summary;

It detects the first instance of a disturbance created by a fault in either voltage or current;

It identifies and labels that particular event using either voltage or current characteristics;

It continues to analyze the transmission line comparing subsequent events to the first using the characteristics as above or predicted characteristics based on knowledge of the transmission line;

It measures time taken for the disturbance to travel from initial characterization, travel to the fault and back as a reflection;

It determines distance to the fault based on time measurement data; and

Distance to Fault calculations are based on a signal propagation velocity constant determined by the type of transmission line.

A Patent to Bunch 4,570,231 describes the same fundamental process that Biskeborn, Weintraub, Biskip, Pardis and Maureira uses, namely:

It detects the traveling wave produced by a fault by at least two receivers on each end of the transmission system;

It synchronizes the timing of the traveling wave reception via some method so distance to fault calculations can be made;

The specific claims of the Bunch patent are:

It comprises a fault finder for locating fault on a high voltage transmission line;

It provides improved filtering to reject background noise to allow easier identification of a fault;

It synchronizes time delay measurements using a conventional modem communication link between the two receiving stations.

A Patent to Burnett 5,243,294 discloses a complex system for determining the likelihood of a physical anomaly in an elongate, electrically conductive member, such as an oil or gas pipeline. The technique is based on sending two pulses from either end of the physical body to be evaluated. Further, It synchronizes the two pulse generators at either end of the physical body so that the collision point of the two pulses traveling from each end can be predicted;

It scans the collision point of the pulses along the physical body; and

It evaluates the characteristics of the collision of the waves to determine the probability of a physical anomaly.

A Patent to Bellis et al 4,491,782 describes improvement to Time Domain Reflectometry, also known as Pulse Echo. This patent Is targeted to unstable, transitory faults, as well as stable faults in energized power cable. It discloses:

Continuing, a TDR technique for power transmission lines is characterized by;

It uses current or voltage sensors to determine if a fault is occurring;

It stores a series of before fault and after fault TDR waveforms; and

It compares the healthy TDR waveforms to the faulty TDR waveforms to aid in discerning the fault location.

A Patent to Walsh 5,382,910 describes improvement to Time Domain Reflectometry by canceling out the blind spot or dead zone inherent in any TDR system during the transmission of the test pulse.

A Patent to Oberg et al. 5,751,149 describes improvement to Time Domain Reflectometry by implementing a very high and adjustable frequency transmit pulse to allow frequency sensitive faults to be more visible to the TDR.

A Patent to Westwood 5,514,965 describes improvement to Time Domain Reflectometry by using new technology, a digital, programmable delay generator device as a TDR timebase to improve resolution of fault reflections.

Continuing, in some cases, such as where a low voltage power is distributed to residences and industry, it can be hazardous to public safety to apply any form of high voltage. Further it is desirable to allow customers to continue to be served with power while a system is being-tested. In that light it is noted that the presently disclosed invention uses the AC signal being distributed as the source of its signal, (emphasis added). This improves upon the Maureira 418 Patent approach, (which may actually create a fault at a previous non-faulted site), by not further damaging the transmission system with a high voltage source. The presently disclosed invention also determines a velocity of propagation, which is used for distance calculations, at an instant just before a fault occurs, which improves accuracy because velocity of propagation can change with cable type, age, time, power loading and ambient temperature. The presently disclosed invention further initiates invention system data storage before a fault, rather than after a fault. This is beneficial because where a fault is catastrophic enough to create a complete open or short circuit, an initiating signal path does not exist.

At this point it is disclosed that the present invention improves upon all the cited prior art by providing initiation of invention system operation before a fault, rather than after a fault. This is important as velocity of propagation can be affected by AC power current loading over time and fault current. Further, the presently disclosed invention provides an initiating signal in the form of a coherent spectrum that can be filtered and amplified to increase resolution and/or noise immunity.

Even in view of the prior art, there remains need for systems which allow detecting and identifying the location of faults on power and/or signal transmission systems with improved accuracy.

DISCLOSURE OF THE INVENTION

The presently disclosed invention is primarily a method of determining the location of a fault on a signal and/or electrical energy transmission line. Said method comprises the steps of:

a) providing an electrical signal and/or energy transmission line and functionally implementing at least first and second transmitter/receiver means for producing and receiving bursts of high frequency signal thereupon, said first and second transmitter/receiver means being separated from one another by a known spatial distance along said electrical signal and/or energy transmission line; and b) providing a means for storing high frequency signal data-transmitted and received by each of said first and second transmitter/receiver means, as a function of time.

Said method further comprises repeating step c until an unexpected burst of high frequency signal not transmitted by either of said first and second transmitter/receiver means, is received by both said first and second transmitter/receiver means, said step c being:

c) while storing high frequency signal data which documents the transmission and receipt of high frequency signals sent and received by both said first and second transmitter/receiver means:

upon receipt of a re-occurring initiating event detected by said first transmitter/receiver means causing said first transmitter/receiver means to generate and transmit a burst of high frequency signal which propagates toward said second transmitter/receiver means, said burst of high frequency signal being received by said second transmitter/receiver means; and at least one selection from the group consisting of:

upon receipt of said re-occurring Initiating event detected by said second transmitter/receiver means, causing said second transmitter/receiver means to generate and transmit a burst of high frequency signal which propagates toward said first transmitter/receiver means, said burst of high frequency signal being received by said first transmitter/receiver means; and upon detection of a signal from the first transmitter/receiver means, after some time causing said second transmitter/receiver means to generate and transmit a burst of high frequency signal which propagates toward said first transmitter/receiver means, said burst of high frequency signal being received by said first transmitter/receiver means.

(Note, the high frequency signals generated and transmitted are typically continuously entered to and stored in a shift-register type memory means for storing high frequency signal, which shift register-type memory pushes data out as new data is entered).

Said method further comprises the step of:

d) upon the detection of an unexpected burst of high frequency signal by, not generated by either said first or second transmitter/receiver means, causing at least transmitted and received high frequency signal data generated in step c which corresponds to the last occurrence of the re-occurring initiating event, and data which documents the unexpected high frequency signal to be fixed in said means for storing high frequency data as functions of time.

Once data pertaining to an unexpected high frequency burst is obtained step e is performed, said step e being:

e) by utilizing data stored in said means for storing high frequency signal data, developing and aligning first and second effective high frequency data plots vs time which correspond to said first and second transmitter/receiver means respectively, so that:

a difference in time between the initiation of the burst of high frequency signal provided by the first transmitter/receiver means in said first effective high frequency data plot vs time, and the receipt of said burst of high frequency signal by said second transmitter/receiver means in said second effective high frequency data plot vs time;

is caused to be equal to:

a difference in time between the initiation of the burst of high frequency signal provided by the second transmitter/receiver means in said second effective high frequency data plot vs time and receipt of said burst of high frequency signal by said first transmitter/receiver means in said first effective high frequency data plot vs time; said effective data plots including data corresponding to detection of said unexpected burst of high frequency signal not generated by either said first or second transmitter/receiver means.

To provide spatial location of a detected fault which was the source of the unexpected high frequency burst, steps f and g are practiced, said steps f and g being:

f) measuring a resulting time difference in said first and second aligned effective plots vs. time between corresponding analogous points in unexpected high frequency signal detected by said first transmitter/receiver means and said second transmitter/receiver means; and g) converting said time difference in said first and second aligned effective plots vs. time between analogous points in the detection of the unexpected high frequency signal or fault by said first transmitter/receiver means and said, second transmitter/receiver means, into a spatial distance of location of said signal and/or electrical energy transmission fault located between said first and second transmitter/receiver means.

It is noted that the step cost ring of high frequency signal data which documents the transmits n and receipt of high frequency signals sent and received by both said first and second transmitter/receiver means is typically at the transmitter/receiver means, it can be at the means for storing high frequency signal data transmitted and received by each of said first and second transmitter/receiver means, as a function of time, which is typically not at the location of either of the first or second transmitter/receiver means. Further, signal transmission between transmitter/receiver means and said means for storing high frequency signal data transmitted and received by each of said first and second transmitter/receiver means, can be via any functional means such as via radio waves, via the internet, via cell phone, via a pathway utilizing a satellite, via infrared or microwave based communication systems etc.

It is also noted that step g is practiced utilizing a Velocity of Propagation (VOP) of the high frequency electromagnetic signal based on data obtained just prior to the fault occurrence.

An alternative method of determining the location of a fault on a signal and/or electrical energy transmission line which utilizes first and second transmitter/receiver means and a receiving means positioned therebetween, comprises the steps of:

a) providing an electrical signal and/or energy transmission line and functionally Implementing thereupon first and second transmitter/receiver means for producing and optionally receiving bursts of high frequency signal, and a receiver means for receiving bursts of high frequency signal, said first and second transmitter/receiver means each being separated from said receiver means which is present therebetween by a known spatial distance along said electrical signal and/or energy transmission line;

b) providing a means for storing high frequency signal data transmitted and received by each of said first and second transmitter/receiver means, as a function of time.

Said method further comprises repeating step c until an unexpected burst of high frequency signal not transmitted by either of said first and second transmitter/receiver means, is received by both said first and second transmitter/receiver means and said receiver means, said step c being:

c) while storing high frequency signal data which documents the transmission and receipt of high frequency signals sent by both said first and second transmitter/receiver means and received by said receiver means:
upon receipt of a re-occurring initiating event detected by said first transmitter/receiver means causing said first transmitter/receiver means to generate and transmit a burst of high frequency signal which propagates toward said receiver means, said-burst of high frequency signal being received by said receiver means; and at least one selection from the group consisting of:
upon receipt of said re-occurring initiating event detected by said second transmitter/receiver means, causing said second transmitter/receiver means to generate and transmit a burst of high frequency signal which propagates toward said receiver means, said burst of high frequency signal being received by said receiver means; and
upon detection of a signal from the first transmitter/receiver means by said receiver means, after some time causing said second transmitter/receiver means to generate and transmit a burst of high frequency signal which propagates toward said receiver means, said burst of high frequency signal being received by said receiver means.

Said method then further comprises the step of:

d) upon the detection of an unexpected burst of high frequency signal by said first or second transmitter/receiver means and/or receiver means, but not generated by either said first or second transmitter/receiver means, causing at least transmitted and received high frequency signal data generated in step c which corresponds to the last occurrence of the re-occurring initiating event, and data which documents the unexpected high frequency signal to be fixed in said means for storing high frequency data as functions of time.

Once data pertaining to an unexpected high frequency burst is obtained step e is performed, said step e being:

e) by utilizing data stored in said means for storing high frequency signal data, developing and aligning first and second effective high frequency data plots vs time which correspond to said first and second transmitter/receiver means to receiver means respectively, so that:
a difference in time between the initiation of the burst of high frequency signal provided by the first transmitter/receiver means in said first effective high frequency data plot vs time, and the receipt of said burst of high frequency signal by said receiver means in said second effective high frequency data plot vs time;

is caused to be equal to:
a difference in time between the initiation of the burst of high frequency signal provided by the second transmitter/receiver means in said second effective-high frequency data plot vs time and receipt of said burst of high frequency signal by said receiver means in said first effective high frequency data plot vs time;
said effective data plots including data corresponding to detection of said unexpected burst of high frequency signal not generated by either said first or second transmitter/receiver means.

To provide spatial location of a detected fault which vas the source of the unexpected high frequency burst, steps f and g are practiced, said steps f and g being:

f) measuring a resulting time difference in said first and second aligned effective plots vs. time between corresponding analogous points in unexpected high frequency signal detected by said receiver means; and g) converting said time difference in said first and second aligned effective plots vs. time between analogous points in the detection of the unexpected high frequency fault signal by said receiver means, into a spatial distance of location of said signal and/or electrical energy transmission fault located between said first and second transmitter/receiver means.

It is also disclosed that step c could be generalized to:

c) while storing high frequency signal data which documents the transmission of high frequency signals sent by both said first and second transmitter means and receipt thereof by said receiver means, in any functional order:
causing said first transmitter/receiver means to generate and transmit a burst of high frequency signal which propagates toward said transmitter/receiver means; and
causing said second transmitter/receiver means to generate and transmit a burst of high frequency signal which propagates toward said transmitter/receiver means;

where a specific re-occurring initiating event is not utilized. Further, the terminology "in any functional order" as just recited can include either the first or second transmitter/receiver means being caused to transmit first, or can include both first or second transmitter/receiver means transmitting substantially simultaneously, (at very near the same point in time).

Another method of determining the location of a fault on a signal and/or electrical energy transmission line, comprising the steps of:

a) providing an electrical signal and/or energy transmission line and functionally implementing at least first and second transmitter means for producing bursts of high frequency signal thereupon and a receiver means for receiving bursts of high frequency signal, said first and second transmitter means being separated from one another by a known spatial distance along said electrical signal or energy transmission line, and said separate receiver means being placed midway therebetween;

b) providing a means for storing high frequency signal data transmitted by each of said first and second transmitter means and received by said receiver means, as a function of time.

Said method further comprises repeating step c until an unexpected burst of high frequency signal not transmitted by either of said first and second transmitter means, is received by receiver means, said step c being:

c) while storing high frequency signal data which documents the transmission f high frequency signals sent by both said first and second transmitter means and receipt thereof by said receiver means, in any functional order:
causing said first transmitter means to generate and transmit a burst of high frequency signal which propagates toward said receiver means; and
causing said second transmitter means to generate and transmit a burst of high frequency signal which propagates toward said receiver means.

Said method further comprises:

d) upon the detection of an unexpected burst of high frequency signal by said receiver means, causing said unexpected burst of high frequency signal and high frequency signal data generated in step c which corresponds to at least the last occurrence of the first and second transmitter generated bursts of high frequency signal, to be fixed in said means for storing high frequency data as functions of time, and e) by utilizing data stored in said means for storing high frequency signal data as a function of time, developing and aligning first and second effective high frequency data plots vs time, so that:

a difference in time between the initiation of the burst of high frequency signal provided by the first transmitter means in said first effective high frequency data plot vs time, and the receipt of said burst of high frequency signal by said receiver means in said second effective high frequency-data plot vs time;

is caused to be equal to:

a difference in time between the initiation of the burst of high frequency signal provided by the second transmitter means in said second effective high frequency data plot vs time, and the receipt of said burst of high frequency signal by said receiver means in said first effective high frequency data plot vs time;

said effective data plots including data corresponding to the detection of said unexpected burst of high frequency signal not generated by either said first or second transmitter means.

Said method then comprises:

f) measuring a resulting time difference in said first and second aligned effective plots vs. time between corresponding analogous points in unexpected high frequency signal detected by said receiver means; and g) converting said time difference determined in step f into a spatial-distance of location of said unexpected burst of high frequency signal between said first and second transmitter means.

As alluded to in reference to methodology recited above, the terminology "in any functional order" as just recited can include either the first or second transmitter means being caused to transmit first, or can include both first or second transmitter means being caused to transmit simultaneously.

While not a limiting application, said methodology is particularly applicable to detecting faults on 50-or 60 Hz AC electrical power transmission lines in which said initiating event detected by said first and second transmitter/receiver means is a voltage and/or current zero crossing which arrives at said first and second transmitter/receiver means at times offset from one another by the time of propagation of said zero crossing between said first and second transmitter/receiver means based on the velocity of propagation thereof along said 50 or 60 Hz AC electrical power transmission line. Said initiating signal voltage and/or current zero crossing propagates from said first to second transmitter/receiver at a slower velocity of propagation than does the burst of high frequency signal transmitted from said first transmitter/receiver means and received by said second transmitted/received means or from said second transmitted/received means to first transmitted/received means.

It should be apparent that where there is no time difference in said aligned effective plots vs. time, between analogous points in the detection of the unexpected high frequency signal or fault by said first transmitter/receiver means- and said second transmitter/receiver means, and the fault on said signal and/or electrical energy transmission line is located substantially half way between said first and second transmitter/receiver means. Where there is a time difference in said aligned effective plots vs. time, between analogous points in the detection of the unexpected high frequency signal or fault by said first transmitter/receiver means and said second transmitter/receiver means, and the fault on said signal and/or electrical energy transmission line is either closer to said first transmitter/receiver means or closer to said second transmitter/receiver means.

High frequency bursts provided by said first and second transmitter/receiver means typically comprise frequencies above 1,000 Hz, and typically will be selected to approximate the expected frequency content of an unexpected high frequency-signal resulting from a fault on the electrical signal and/or energy transmission line so as to provide substantially similar velocity of propagation. An acceptable practice however, can involve the frequency of the unexpected high frequency signal being on the order of One (1) MHz and that of the high frequency bursts transmitted by said first and second transmitted/received means being on the order of 300–500 KHz.

It is specifically mentioned that as presented above, said method of determining the location of a fault on a signal and/or electrical energy transmission line can involve providing more than two transmitter and/or receiver means, (eg. two transmitter/receiver means and a receiver means located functionally with respect thereto, or three transmitter/receiver means and the like, for instance).

Further, the means for storing high frequency signal data transmitted and received by each of said first and second transmitter/receiver means, as a function of time is typically a data acquisition memory configured in a manner which allows multiple fault events to be stored and retained. That is, for instance, where a fault does not cause a power transmission system to fail, data pertaining to Its occurrence can be preserved even where the presently disclosed invention immediately proceeds to further monitor the transmission system by practice of the steps a–d in the above recited method.

For insight, it is also noted that non-limiting examples of electrical energy and/or signal transmission lines for which the presently disclosed method of determining a location of a fault can be applied include:

multiple electrical conductors combined into a system;
single phase power transmission system;
three phase power transmission system;
aircraft power transmission system;
spacecraft power transmission system.
commercial or naval ship power transmission system;
signal and/or electrical energy transmission line in a localized industrial power transmission system.

For emphasis it is again noted that the present invention uses a Velocity of Propagation (VOP) of a high frequency signal on a transmission systems determined before, rather than after a fault event. This is beneficial because a (VOP) determined after a fault event can be erroneous in that the Velocity of Propagation (VOP) can change with current load, and a fault causes excess current to flow in the transmission system. Also the rapid change in the AC voltage sine wave caused by the fault event disrupts the timing along the transmission line.

It is also noted that the disclosed invention can be utilized to determine velocity of Propagation, (VOP) of the transmission system to high frequency signals even in the absence of a fault occurring. A user can simply obtain data and perform steps in the methodology which do not pertain to determining fault location to determine time between a signal transmission and its receipt, then divide the known separation distance thereby.

Alternatively stated, the present invention is primarily a method of determining the location of a fault on a signal and/or electrical energy transmission line which begins with functionally implementing at least two invention transmitter/receivers on a transmission line) said transmitter/receivers being separated by a known distance, (eg. at both ends of the transmission line under test, or both ends and a mid-point). The important point is at least two transmitter/receivers need to be placed with at least one thereof being on one side of the fault site and another on the other side of the fault. Said invention transmitter/receivers provide a method of connecting or coupling, (ie. functionally implementing), a transmitter/receiver to the transmission line, (eg. as power line carrier systems use), band pass filtering and/or digital signal processing based filtering, and a memory to store the analog waveforms sampled from the transmission line under test. Said system, in use, provides an accurate sampling of the analog signal on the cable versus time. As an example, it is noted that a data acquisition system operates much like a digital sampling storage oscilloscope. In addition, the invention transmitter/receivers contain circuitry for detection of a initiating event that will create a burst of high frequency energy or marker, detection circuitry of a power signal zero cross, and detection and storage circuitry of the fault transient wave, a microprocessor for system control and peripheral elements such as enclosure, battery, power supplies, etc. The invention transmitter/receivers continually store high frequency data from the transmission line under test versus time, in internal memory. While the invention transmitter/receivers (both and/or all) are operating to store the high frequency data from the transmission line, the transmitter/receivers detect a initiating event that, in the preferred embodiment is derived from the signal or energy waveform being transmitted over the monitored electrical transmission line. Where power is being transmitted this event is preferably chosen to be the 50 or 60 Hz power signal voltage or current zero crossing, which it is noted has a propagation rate which is much slower than the high frequency burst or marker signal. When a zero crossing is detected by a disclosed invention transmitter/receiver, said transmitter/receiver generates a high frequency burst or marker signal which is coupled to and transmitted onto the transmission line under test. Because the transmitter/receiver is continuously storing high frequency data, the marker signal is also stored in internal memory of the transmitting invention transmitter/receiver. This high frequency burst or marker propagates along the transmission line to another disclosed invention transmitter/receiver connected to the transmission line under test. The other transmitter/receiver is also continually storing high frequency data versus time, so the marker is stored in the second (or any other) invention transmitter/receiver memory. In the preferred method, the marker detection circuitry is implemented in a manner that insures data before and after the initiating event is always stored in memory. As the 50 or 60 Hz power signal propagates down the transmission line under test, the second invention transmitter/receiver also-detects the zero crossing of the power signal and transmits its own high frequency burst marker signal onto the transmission line under test. Because all transmitter/receivers are continuously storing high frequency data, the marker signal is also stored in internal memory of each invention transmitter/receiver deployed on the transmission line under test. This high frequency burst or marker propagates back along the transmission line to the first invention transmitter/receiver, (or another invention transmitter/receiver), connected to the transmission line under test and is stored in its internal memory. Exchanging high frequency bursts or markers essentially creates the means by which the fault data from independent invention transmitter/receivers can be coordinated in time and therefor distance. (Note, Additional clarification of the marker signal exchange is contained later herein).

To elaborate on the handling of fault signals it is emphasized that, as indicated above, the invention transmitter/receivers are routinely collecting and storing high frequency data from the transmission line under test. When an arcing or discharge fault occurs, a wave of energy emanates from the fault site and travels in both directions away from the fault site. The fault event wave travels at essentially the same propagation rate as the high frequency burst or marker signal. The lover frequency 50 or 60 Hz power signal travels much-slower than the high frequency burst or marker signal and the unexpected high frequency burst or fault signal. While not limiting, in the preferred method, the 50 or 60 Hz power signal inherent on the power-distribution-system is used to trigger the exchange of the transmitter/receiver's high frequency burst or marker signals. Both, (or all where more than two transmitter/receivers are present), invention transmitter/receivers store the high frequency fault event in memory versus time as the wave passes their respective locations. In the case where two invention systems are present, if the fault event is closer to the first invention transmitter/receiver, the fault wave will reach the first transmitter/receiver sooner than the second transmitter/receiver. If the fault event is exactly in the middle of the transmission line under test, the fault event wave will reach both transmitter/receivers at the same time. If the fault event is closer to the second invention transmitter/receiver, the fault wave will reach the second transmitter/receiver sooner than the first transmitter/receiver. Circuitry in each of the invention transmitter/receivers detects when a fault wave has passed that transmitter/receiver and, after a predetermined time, each of the transmitter/receivers in turn suspends storage of new high frequency data. The fault detection circuitry is implemented in a manner that insures data both before and after the fault event is stored in memory. After detection of a fault, each invention transmitter/receiver then contains a static record of high frequency magnitude versus time, of marker signals transmitted and received from both (all) transmitter/receivers and of the fault wave as it passes that respective transmitter/receiver. The time relationships between the marker signal exchange and the fault wave are maintained and said stored high frequency data are then transferred to a display mechanism for evaluation. The transmitter/receivers have stored the data with common time base resolution so the individual data arrays can be plotted versus time together with the same time base. To properly adjust the display of two or more invention transmitter/receivers, the marker signal delay from the first transmitter/receiver to the second transmitter/receiver T1, (assuming two transmitter/receivers are utilized), must equal the marker delay from the second transmitter/receiver to the first T2. Because the marker signals have traveled the same distance on the same transmission path and are the same frequency, they have the same velocity of propagation. By plotting the marker and fault data arrays from each transmitter/receiver and aligning the time delays associated with marker signal exchange, (i.e., making T1 equal to T2), and evaluating the relative time delays ass cited with the fault wave passing each transmitter/receiver, utilizing the velocity of propagation the fault wave time delay differences may be converted to distance relative to the distance separating the invention transmitter/receivers.

As alluded to above, further clarification of marker exchange is discussed directly. Upon power up, both, (or all where more than two transmitter/receive systems are present), transmitter/receivers enter a mode of continually recording high frequency data from the transmission line under test, and await a zero crossing initiating event. The transmitter/receiver closest to the power source is the first to receive the initiating event, (eq. the 50 or 60 Hz power signal). Upon receipt of the initiating event, the first transmitter/receiver is triggered to generate, store, and transmit a marker signal. Both the marker and the initiating event will propagate down the transmission line under test. But the marker is traveling at a much higher speed than the initiating event so it gets to the second transmitter/receiver before the initiating event. The second transmitter/receiver receives-and stores the first transmitter/receiver's marker (the marker propagation time from first transmitter/receiver to the second transmitter/receiver is called T1). Some time later, the initiating event, (eg. a 50 or 60 Hz power signal), propagates to the second transmitter/receiver and triggers the second transmitter/receiver to generate, store, and transmit its own marker back toward the first transmitter/receiver. Some short time later the first transmitter/receiver receives and stores the second transmitter/receiver's marker (the marker propagation time from second transmitter/receiver to the first transmitter/receiver is called T2). Referenced to the initiating event, both transmitter/receivers have generated, stored, and transmitted a marker and each transmitter/receiver has received and stored a marker from the other transmitter/receiver. Both markers have traversed the same cable and have the same velocity of propagation. Therefore, importantly, it can be reasoned that T1=T2. The initiating event triggers each of the transmitter/receivers to continue storing data for some predetermined time after the initiating event. After this predetermined time, the storage of data line terminated. As noted above, the first transmitter/receiver's marker reaches the second transmitter/receiver before the initiating event. Therefore, it is clear that there has to be a certain amount of data acquired before the initiating event. In the displaying of the two independently collected waveforms, the waveforms are correctly aligned horizontally (time) when the second transmitters receiver's waveform is moved (left or right) horizontally with respect to the first transmitter/receiver's waveform until T1 equals T2, (they are equal in time, but have to be made equal in distance as shown across the display mechanism). Considering a fault situation, once, the invention transmitter/receivers have transmitted and stored markers, they will monitor the transmission line for a fault event. When a fault occurs, it will be located some distance away from each transmitter/receiver, but will be between the transmitter/receivers. Upon the occurrence of a fault, transient fault waves, (one traveling towards the first transmitter/receiver and on traveling towards the second transmitter/receiver), propagate away from the fault site in the cable at a velocity of propagation sufficiently similar to that of the markers so as to give a sufficiently accurate measurement to the fault. In time, each transmitter/receiver receives and stores the high frequency fault data. Each transmitter/receiver is designed to save some data before the fault and some data after the fault. Having data before and after an event (initiating and fault) allows the operator to properly align and see a clear picture as to when the events happened as they arrive at the transmitter/receiver and thus allow for proper calculations to determine the distance from the transmitter/receivers to the fault.

A disclosed invention method of triggering marker exchange involves, as described above, the detecting of a Initiating event, (eg. the AC power zero volt 20' crossing) then involves the generation, storage, and transmitting of a high frequency burst or marker signal. Exchanging high frequency bursts or marker signals creates the means by which the fault data from independent invention transmitter/receivers can be co-ordinated in time and therefore, distance. (Also note that since the 50/60 HZ signal has a lover Velocity of Propagation (VOP), it is the same zero-crossing cycle that triggers all the transmitters/receivers).

An alternative initiating method involves, as described above all transmitter/receivers being identical, and at random intervals, each invention transmitter/receiver transmitting a marker. Statistically, one transmitter/receiver transmits its marker before the other transmitter/receivers. Therefore, this first transmitter/receiver becomes the master transmitter/receiver for initiating the exchange of markers; the other transmitter/receivers become slave transmitter/receivers, waiting for the reception of the master transmitter/receiver's marker signal to start a predetermined timing delay before transmitting their own markers. As an example, upon power up each transmitter/receiver's random marker interval is between 15 and 20 milliseconds. Statistically, one transmitter/receiver will transmit its markers before the others and it becomes the master marker generator. The other transmitter/receivers become slaves, and transmit their markers at random intervals 2–4 milliseconds after they receive markers from the first transmitter/receiver. This concept of master-slave transmitter/receivers can be expanded such that, on a transmission line where there are several transmitter/receivers, each transmitter/receiver in the group of transmitter/receivers develop a sequence as to when, after the marker is received from the first transmitter/receiver, each transmits its marker so that each successive transmitter/receiver triggers the next to delay, then transmits its marker. Also, an independent exchange of marker signals, not referenced to the AC power signal, allows fault location on a DC power distribution system. In such a case an external power source, AC or DC, is applied to the transmission line of a magnitude sufficient to trigger an arcing or discharge fault. While not preferred this approach allows practice of the disclosed invention cases where fault location is needed and no power signal is present.

It is to be understood that the terminology "High frequency burst or Marker signal" as used in this Specification, refers to a burst of several cycles of electromagnetic wave, (eg. sinusoidal), generally in the range of 100 KHz to 1 MHz, which is transmitted on a transmission line under test and which is stored in memory by invention transmitter/receivers. The exchange of this marker signal provides a method to co-ordinate the stored data in two or more independent systems, i.e. the invention transmitter/receivers.

Further, an unexpected burst of high frequency signal or fault is to be considered as being a transient wave produced by an arcing or discharge fault that travels away from the fault site in both directions along the transmission line under test. While of similar frequency content, it is not generated by the invention transmitter/receivers and is different than the high frequency burst or marker signal used to initiate stored data in invention systems.

An electrical signal and/or energy transmission line, transmission system, distribution system, cable or cable under test, in this specification refers to at least two metallic conductors separated by a dielectric medium that exhibit traditional electromagnetic wave propagation characteristics and/or serve as the distribution medium for analog signals, data or electrical power.

The invention transmitter/receivers act as transmitter and receiver of marker signals and fault signals, and store said data in internal memory.

The velocity of Propagation, (VOP) or Velocity factor is the the velocity of an electromagnetic wave as it travels along a transmission line. Velocity of propagation is commonly expressed as a percentage of the speed of light in a vacuum or as feet or meters per microsecond. The speed of light being presently defined as 299,792,458 m/s (meters per second).

It is to be understood that first and second effective high frequency data plots vs time which correspond to signals are termed "effective" because, while visual presentation will typically be utilized, said plots vs. time need not be in the form of actual plots, but instead can be data in computer memory which is manipulated by an algorithm to provide the location of a fault.

An electrical Power source to initiate a fault event may be the power signal being distributed by the transmission line or an external AC source. In a special case, a DC power source can be used in place of the zero volt crossing of the power signal.

Calculating Distance From Transmitter/Receiver to Fault

Finally, mathematics for analyzing data provided by practice of the disclosed invention is presented directly. In this description, there are two cases:

1. Two transmitter/receivers are used to find the distance to the fault, where the fault is located between the transmitter/receivers and the transmitter/receivers are close enough together that they can detect and store each other's markers.
2. Three or more transmitter/receivers are used to find the distance to the fault. This would be the case where the two transmitter/receivers that are on either side of the fault are too far apart that they cannot detect and store each other's markers. In this case, a third transmitter/receiver would be placed some distance away from one of the other transmitter/receivers such that they are close enough together that they can successfully exchange markers.

In both cases, the assumptions are (A) the VOP of the cable is unknown but has to be determined and (B) the VOP is sufficiently homogeneous over the length of the cable, so as to allow sufficiently accurate measurement to the fault.

For Two Devices

The point on the cable at where the fault occurs is identified as P.

The distance from the fault F to the first transmitter/receiver is A.

The distance from the fault F to the second transmitter/receiver is B.

F is between A and B.

The known distance between the two test transmitter/receivers is L.

Then L=A+B.

The time it takes for the fault to travel from F to A is a.

The time it takes for the fault to travel from F to B is b.

The known time difference between the two travel times from the fault F to each transmitter/receiver is (a−b).

The time for the markers to traverse the cable from one transmitter/receiver to the other is called T1 and T2.

Since T1 is the time it takes for the first transmitter/receiver's marker to go from the first transmitter/receiver to the second and T2 is the time it takes for the second transmitter/receiver's marker to go from the second transmitter/receiver to the first, can be said to be T1=T2. This is time t.

The velocity of the markers is L/t in feet per usec or meters per usec.

Assume that (A) the velocity of the markers and the velocity of the fault are sufficiently similar so as to allow the sufficiently accurate calculation of the distance to the fault and (B) the VOP of the markers and the fault are constant over the full length of the cable.

Therefore, it can be said that A/a=B/b=L/t.

Now, by substituting common values between independent formulas and finding the unknowns from the known formulas:

$$A/a=((A+B)A)/(a-(a-b))Aa-A(a-b)=a(A+B)-aa2Aa=a(A+B)+A(a-b)Aa=(a(A+B))/2+(A(a-b))/2A \ (a(A+B)/2)/(a-(a-b)/2).$$

Now, for the special case where there are only two transmitter/receivers on the cable under test:

From above A/a=L/t which can be re-written as $$A=L(a/t).$$

Now combining two independent formulas:

$$L \ a/t=(a(A+B)/2)/(a-(a-b)/2).$$

So it can be re-written that:

$$a=(t \ L/2+L(a-b)/2)/L.$$

And further:

$$a=((L/2)/(L/t))+((a-b)/2).$$

Which can be further simplified to:

$$a=((+(a-b))/2).$$

And further:

$$A=L(a/t).$$

And further:

$$b=((L/2)/(L/t))-((a-b)/2).$$

Which can be further simplified to:

$$b=(t-(a-b))/2.$$

And further:

$$B=L(b/t).$$

For Three Devices

The point on the cable at where the fault occurs is identified as F.

The distance from the fault F to the first transmitter/receiver is A.

The distance from the fault F to the second transmitter/receiver is B.

F is between A and B.

The known distance from the first transmitter/receiver to a middle transmitter-receiver is C.

The known distance between the two test transmitter/receivers is L.

Then:

$$L=A+B$$

The time it takes for the fault to travel from F to A is a.

The time it takes for the fault to travel from F to B is b.

The time difference between the two travel times from the fault F to each transmitter/receiver is a−b.

The time for the markers to traverse the cable from the first transmitter/receiver to the middle transmitter/receiver is called T1 and T2.

Since T1 is the time it takes for the first transmitter/receiver's marker to go from the first transmitter/receiver to the middle and T2 is the time it takes for the middle transmitter/receiver's marker to go from the middle transmitter/receiver to the first, it can be stated that:

$$T1=T2.$$

This is termed time t.

The velocity of the markers is C/t in feet per usec or meters per usec.

Assume that (A) the velocity of the markers and the velocity of the fault are-sufficiently similar so as to allow the sufficiently accurate calculation of the distance to the fault and (B) the VOP of the markers and the fault are constant over the full length of the cable. Therefore, it can be-said that:

$$A/a=B/b=C/t.$$

Now by substituting common values between independent formulas and finding the unknowns from the known formulas:

$$A/a-((A+B)-A)/(a-(a-b))Aa-A(a-b)=a(A+B)-Aa2Aa=a(A+B)+A(a-b)Aa=(a(A+B)/2)+(A(a-b)/2)A=(a(A+B)/2)/(a-(a-b)/2).$$

From above:

$$A/a=C/t;$$

which can be re-written as A=C a/t.
Now combining two independent formulas;

$$Ca/t=(a(A+B)/2)/(a-(a-b)/2).$$

So it can be re-written that:

$$a=(t(A+B)/2+C(a-b)/2)/C.$$

For the general case where there are three or more transmitter/receivers on the cable under test.
And further:

$$a=(((A+B)/2)/(C/t>)+((a-b)/2);$$

And further:

$$A=C(a/t);$$

And further:

$$b=(((A+B)/2)/(C/t))-((a-b)/2);$$

And further:

$$B-C(b/t).$$

To better understand the disclosed invention, an example is provided directly premised on an electric power customer receiving power from a low voltage (110 to 240 VAC) 50 or 60 Hz AC power cable. Consider that the customer is experiencing unreliable electrical service over time due to intermittent transient arcing at an unknown-location on the distribution cable. The build up of an electrical conductive path from one conductor to either ground or another power phase and the AC power voltage on the line are the cause of the intermittent transient arcing fault and, together, they will eventually initiate the arcing voltage fault. Many times this arc actually burns away the conductive path so, after an instant of arcing, the fault no longer exists and, when a test technician reaches the site, he has nothing to find. The power cable now remains in good-service until, over time, the conductive path again builds up and initiates another arcing fault. The electric service provider, which has fielded the customer's complaints, desires to locate and repair the fault expeditiously which means with accuracy, safety, and minimum of further disruption to the customers service. Existing techniques of cable fault location, while functional where a total cable breakdown has occurred, are not useful in locating intermittent faults for a variety of reasons, the most important of which are their inability to determine the exact velocity of propagation (VOP) at the time of the fault and to locate an intermittent fault that appears to be self healing once it has had an arc discharge. Time Domain Reflectometry techniques do not work well because normally, they require the cable under test- to be taken out of service during the test and because they gather sampling points over time and are self triggered rather than triggered by the event, they normally rely on a dead short-or open and they usually cannot find short duration, intermittent problems. And, they don't have the ability to determine the cable correct (VOP) at the instant of the faulting arc. Historically, Time Domain Reflectometry techniques require a relatively long time to acquire a full waveform in that they use a single point sample and store technique, and they inject their own signal onto the cable under test that is random with respect to the 50 or 60 Hz power signal but is timed from the point of view of the TDR. The TDR is looking for a continuous major discontinuity and the arcing fault may only occur for an instant before it is self-healing. The time relationship between the 50 or 60 Hz and short duration arc do not match themselves with the repetitive sampling transmit and receive nature of the classical and common TDR. A completely different technique, that of the standard Breakdown technology, requires that the power line be taken out of service so that the cable can be stressed with high voltages. This can be a further inconvenience for the customer, causes further unforeseen damage to the power cable under test, and can involve safety issues to the operating technicians. The present invention discloses a new technology that allows the service technician to solve intermittent arcing fault problems. The greatest advantages of this new technology over the classical TDR and the breakdown, (ie. "thumper"), technologies are:

short duration faults can be detected and found during the testing time, the cable under test remains in service delivering power to the customer, and the arcing voltage is not a foreign voltage that can further damage the distribution cable, customer equipment, or become a safety issue to the customer or the test technician.

Two identical instruments are attached to the cable under test, one at each end of the suspect cable and at a known distance apart. While the instruments are waiting for a transient fault, they are exchanging marker signals with each other. This exchanging of markers will allow the instruments software to accurately determine the cable (VOP) at the instant of the arcing fault. Fault location is only as accurate as is the determination of the (VOP) for the cable, which can vary widely as conditions change such as moisture, the cable age, gauge, its temperature and its power loading. The method disclosed herein uses a system of markers generated, stored, transmitted, and received by each instrument as a means of accurately determining the VOP an instant before an intermittent fault occurs.

The presently disclosed invention method then relies on the fact that the (VOP) of 50 or 60 Hz is approximately 6% of the VOP of light; which means that one cycle will span about 1,200,000 feet or two hundred miles of cable. Therefore it is clear that, given the relatively short lengths of cable under test, both instruments will be monitoring the same cycle of AC power. The method relies on the fact that the VOP of the marker signal and the transient fault (both with fundamental frequency components between 100 KHz and 1 MHz) in a power cable is about 65% of the speed of light. This means that all other instruments on the cable under test will receive the marker signal generated by the first instrument before the zero crossing of the AC power cycle travels from the first instrument to the second instrument. Likewise it means that a transient will travel from the fault to the instruments on either side of it at a VOP that is, for all intents and purposes, equal to the VOP of the markers. The first instrument senses a zero crossing of the slower moving 50 or 60 AC power signal passing that instrument which causes it to generate, store and transmit a higher frequency, and thus faster traveling marker, which propagates to, and is stored by, the second instrument. Some time later as the zero crossing point of the slower moving 50 or 60 Hz power signal reaches the second instrument, the second instrument generates, stores and transmits a higher frequency marker which propagates to, and is stored by, the first instrument. It is a given that the time for the marker generated by the first instrument to travel to the second is equal to the time for a marker at the same frequency to travel from the second instrument to the first a short time later. This fact coupled with the known length of separation between the instruments allows the VOP to be accurately calculated. The instruments continue to generate, store, transmit, and receive markers to each other as AC power voltage zero crossing points pass until such time as a fault transient occurs and is detected and stored by each along with the markers that immediately preceded the fault event. The differential in the time it takes the transient to reach each instrument coupled with the VOP calculated by using the markers and distance between the instruments allows, by using the instruments software, an accurate distance to the fault from each instrument to be determined.

The disclosed invention will be better understood by reference to the Detailed description Section of this Specification, in conjunction with the Drawings.

SUMMARY

Primary purposes and/or objectives of the disclosed Invention are to provide a system for and method of identifying the location of faults on energy and/or signal transmission lines which simultaneously:

applies at least first and second monitoring systems which transmit high frequency signal therebetween during normal operation;

allows the transmission system to remain in service during fault locating;

is passive in that it does not require an external high voltage source to sufficiently stress the transmission system to cause discharge, hence does not risk further damage and degradation to the transmission system as is the case where a high voltage source is applied during testing;

rather than arbitrarily set a velocity of propagation, determines velocity of propagation which is used for distance calculations, the instant before a fault occurs, thus improving accuracy;

time co-ordinates the invention systems before the fault rather than after the fault, because if a fault is catastrophic enough to create a complete short circuit, then an initiating signal path would not exist;

Additional purposes and/or objectives of the disclosed invention will become apparent upon a reading of the Specification and claims.

DETAILED DESCRIPTION

Figure 1:
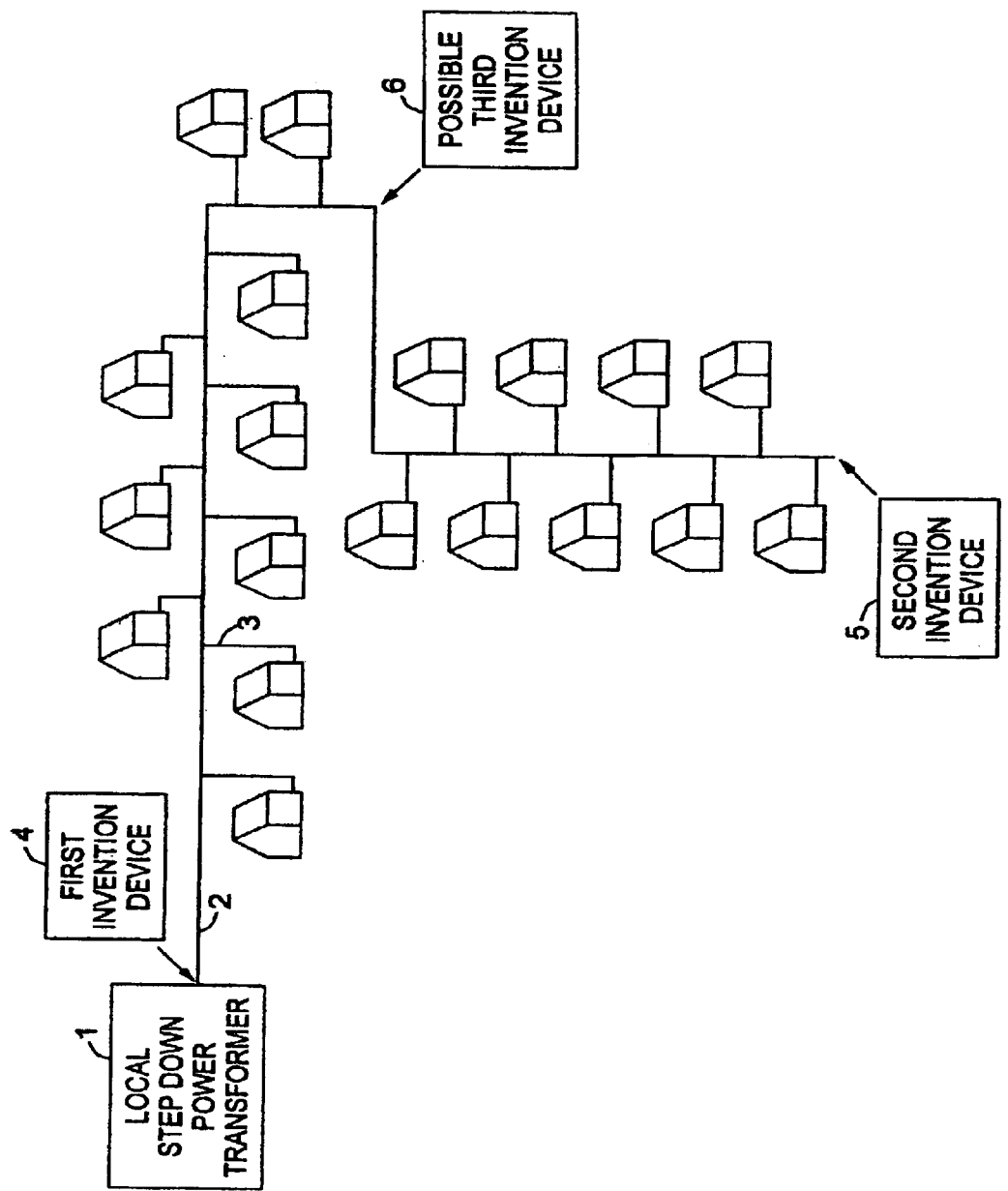
FIG. 1 illustrates a typical power distribution system which distributes power to a specific residential, commercial or industrial area.

FIG. 1 illustrates a typical power distribution system which includes a local step down transformer (1) with a three phase medium voltage input and a three phase low voltage output (240 VAC) to distribute power to an area. Typically, there are several three phase cables leaving a single transformer but, for simplicity, only one cable (2) is shown. The cable is routed through an area and customer services (3) are connected to the distribution cable. The cable typically has all three phases within a single insulating jacket. Each successive customer is connected to a different phase, so that roughly every third customer is on a common phase. Invention transmitter/receivers have been placed at preferred locations on the network, one transmitter/receiver at the power source transformer, (4) the other at the end of the distribution cable (5). Additional transmitter/receivers could be placed at other points on the network (6).

Figure 2:
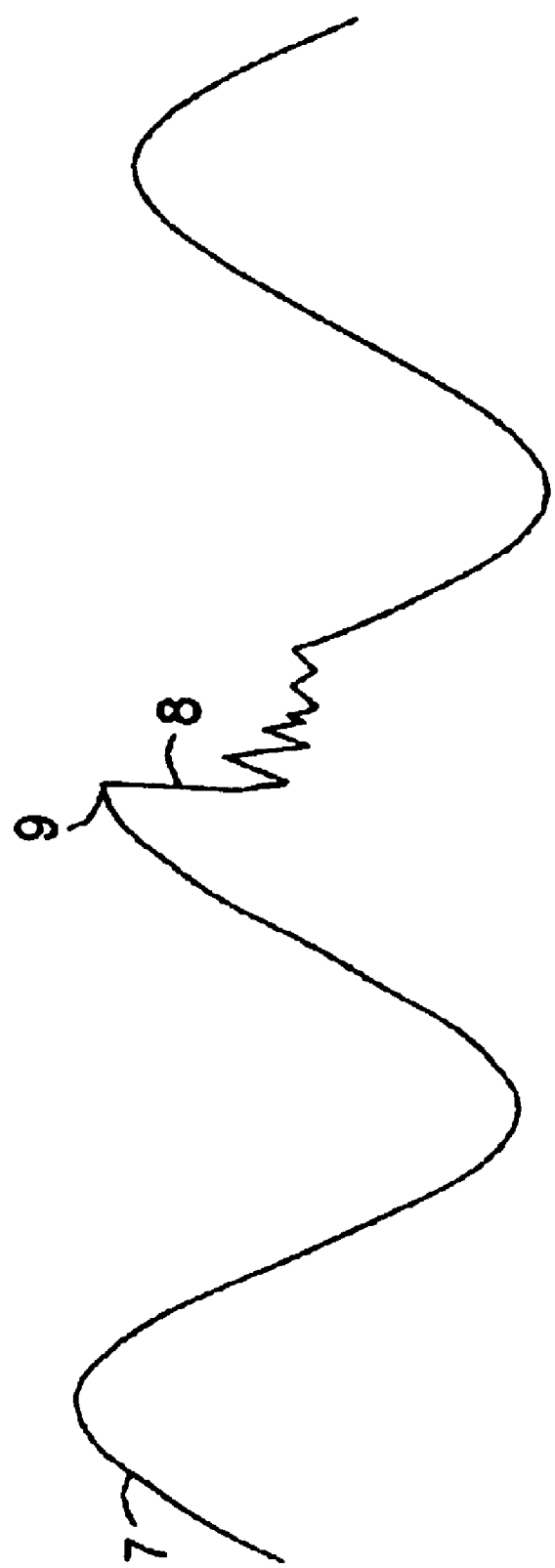
FIG. 2 shows a 50 or 60 Hz power signal, as would be found on the preferred embodiment power distribution system in FIG. 1, with the signals associated with an arcing or discharge fault.

FIG. 2 shows a 50 or 60 Hz power signal sine wave (7), as would be found on the power distribution system in FIG. 1. An intermittent arcing or discharge fault (8) has occurred near the maximum voltage of the power signal sine wave (9). This very sudden, very low impedance event quickly collapses the power signal voltage and discharges significant current into the low impedance short circuit. This in turn, produces a high frequency wave, represented by the very sharp edge of (9), which propagates in both directions on the transmission line.

Figure 3:
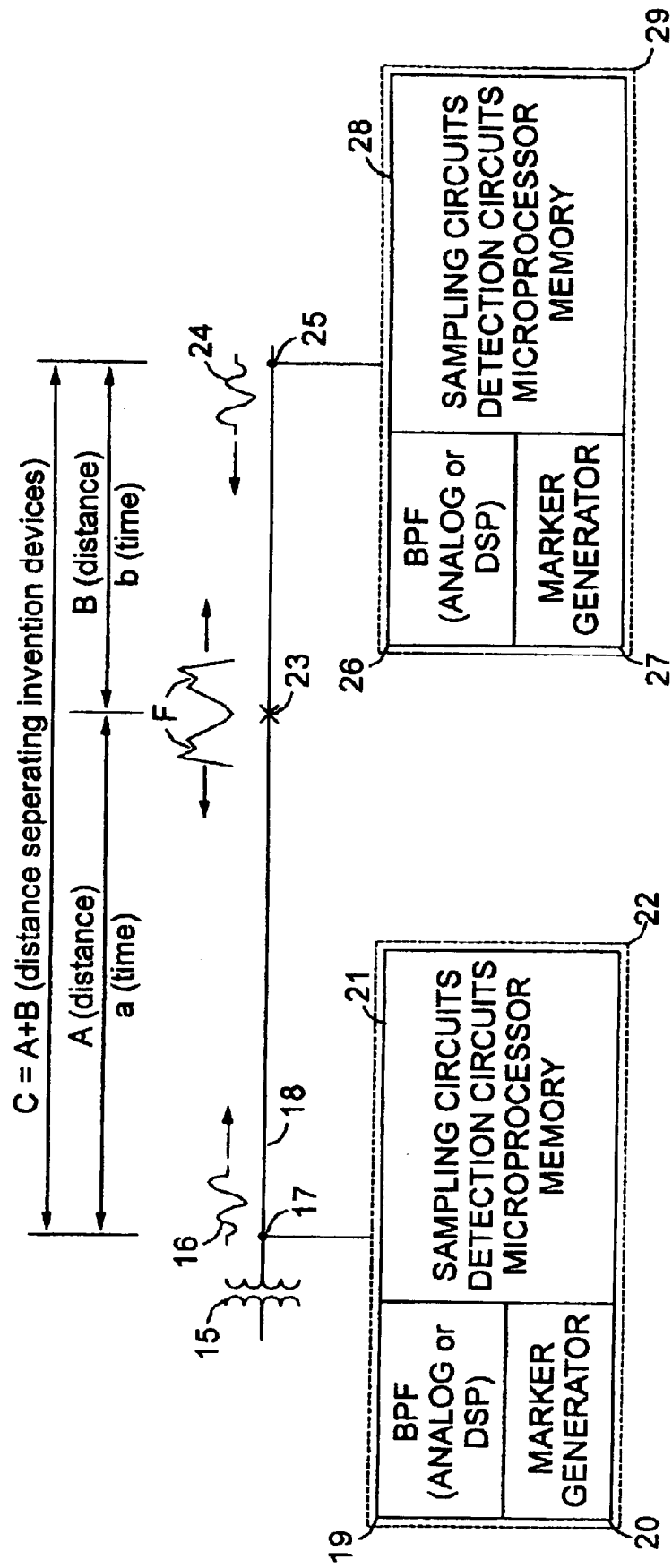
FIG. 3 is a simplified power distribution system with deployed invention transmitter/receivers, a fault and the electrical signals associated with the fault and the invention transmitter/receiver's markers.

FIG. 3 is a simplified power distribution system with deployed invention transmitter/receivers and an arcing or discharge fault (23) somewhere along the distribution cable (18). The first invention transmitter/receiver (22) is deployed at or near (17) the power source transformer (15). The second transmitter/receiver (29) is deployed some distance away (C) near the end of the distribution cable (25). Both invention systems are identical, and contain band pass filter circuitry or DSP systems for filtering (19) (26), plus circuitry (20) (27) to produce a high frequency burst or marker signal (16) (24), marker signal detection, fault signal detection, sampling systems, microprocessor and memory circuits (21) (28). An arcing or discharge fault (23) produces waves (F) that travel in both directions away from the fault site. The distance (A) is the physical, spatial distance from the fault site to the first invention transmitter/receiver located at point (17). The distance (8) is the physical, spatial distance from the fault site to the second invention transmitter/receiver located at point (25). When a fault occurs and produces the transient traveling wave (F), it takes some time (a) for the wave to propagate to the first invention transmitter/receiver located at point (17) and some time (b) for the wave to propagate to the second invention transmitter/receiver located at point (25).

Figure 4:
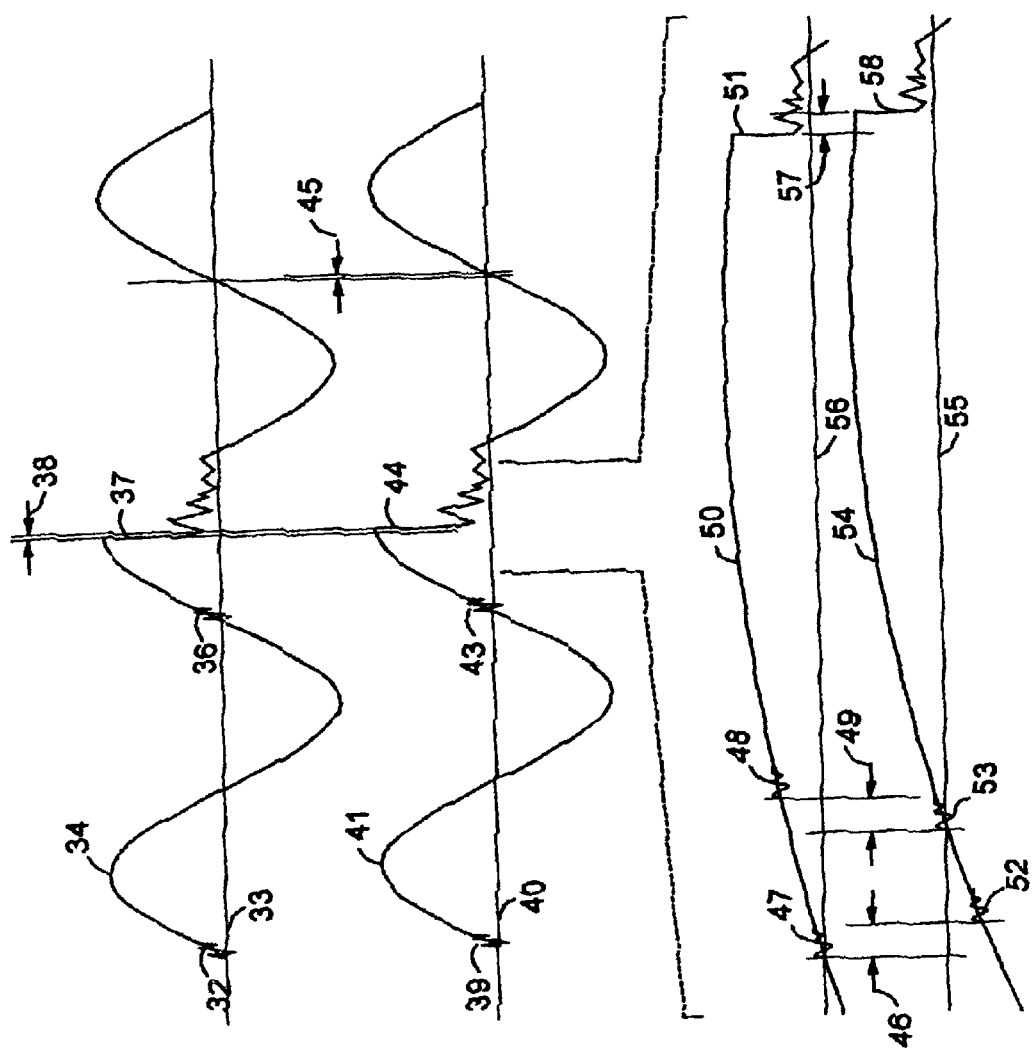
FIG. 4 is an expanded drawing showing the timing of the power signal, invention transmitter/receiver marker signal, the fault wave and associated timing.

FIG. 4 is an expanded drawing showing the timing of the power signal, invention transmitter/receiver marker signal and the fault wave signal. This drawing illustrates the fault-location method as described in the Description of the Invention section of this document. The top most waveform is the power signal (34) as seen by the first invention transmitter/receiver deployed on the distribution system. Below is the power signal waveform (41) as seen by the second invention transmitter/receiver, delayed slightly in time due to propagation of the power signal along the distribution system. After the invention transmitter/receivers have been deployed on the network and initialized, operation is as follows. The first transmitter/receiver detects a zero volt crossing of the power signal represented by line (33). The instant a zero cross is detected, the first invention transmitter/receiver generates, stores in it own memory and transmits a high frequency burst or marker signal (32) onto the power distribution network. Because the first invention transmitter/receiver is continuously sampling and storing high frequency data from the network versus time, much like a digital sampling storage oscilloscope, it will store a digital representation of its own marker (32) in memory. As the power signal propagates down the transmission-system, the second invention transmitter/receiver also detects the zero crossing of the power signal represented by line (40) and in turn generates and transmits a high frequency burst or marker signal (39) onto the power distribution network. Because the second invention transmitter/receiver is also continuously sampling and storing high frequency data from the power network versus time., much like a digital sampling storage oscilloscope, it will store a digital representation of its own marker (39) in memory. If no fault signal (37) and (44), has been detected by the invention transmitter/receiver's internal circuitry, both transmitter/receivers will detect the next power signal zero volt crossing, generate a new marker signal, (36) and (43), and overwrite its internal memory with a new record of the high frequency data from the power network. This process continues each cycle until internal fault detection circuitry detects a fault occurrence and inhibits overwriting the most recent stored record of marker signals. Below the power signal representations is an expanded view of the power signal, invention transmitter/receiver markers signals and an occurrence of a fault. The power signal (50) at the first invention transmitter/receiver crossing zero volts (56) triggers the generation of a marker signal (47) and it is stored in memory, then transmitted onto the transmission line. The marker signal propagates to the second invention transmitter/receiver (52) where it is also stored in memory. The power signal, having a much lover velocity of propagation than the high frequency marker because of its lover frequency, propagates eventually to the second transmitter/receiver (54) and crosses zero volts some time later, represented by time delay (45) in the upper illustration. When the power signal (54) at the second invention transmitter/receiver crosses zero volts (55) it also triggers the generation of a marker signal (53) where it is also stored in memory, then transmitted onto the transmission line by the second transmitter/receiver. The second transmitter/receiver'marker signal propagates back to the first invention transmitter/receiver (48) where it is stored in the memory of the first invention transmitter/receiver. The two (or more) inventions transmitter/receivers have now exchanged and stored marker signals that represent the two propagations delays T1 (46) and T2 (49) and both represent the electrical length of (C) in FIG. 3. Included in the expanded view of FIG. 4 is the representation of the fault wave (F) from FIG. 3. The fault wave Is produced at a specific instant in time when the fault occurs and travels in both directions from the fault site to each invention transmitter/receiver on the power distribution network. Because each invention transmitter/receiver is sampling and storing high frequency signals on the network for the power cycle, as the fault wave passes the first (51) and second (58) invention transmitter/receivers, it is digitized and saved in memory. The difference in time when the fault wave passes the two invention transmitter/receivers (57) represents the algebraic difference of (a–b) in FIG. 3. If the data stored in each invention transmitter/receiver is aligned in time, assuming T1 must be equal to T2 because each marker traveled the exact same electrical distance, also assuming the velocity of propagation rates of the marker signals and fault signals are equal because they are approximately the same frequency, and using the distance separating the invention transmitter/receivers as a known, a relative distance to fault can be calculated by using the algebraic formula provided directly.

Figure 5A:
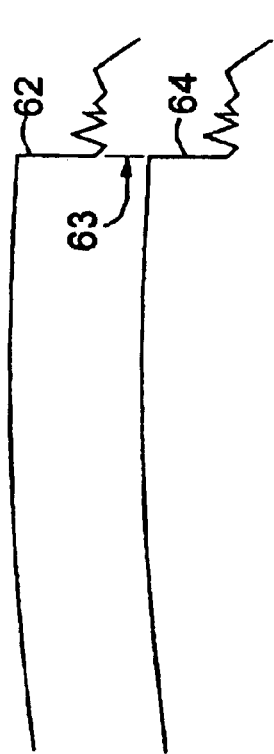
FIGS. 5A, 5B and 5C illustrates timing differences associated with the fault transient wave versus locations on the power system.
Figure 5B:
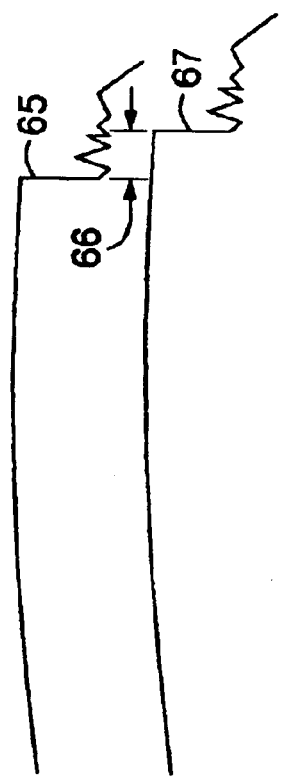
Figure 5C:
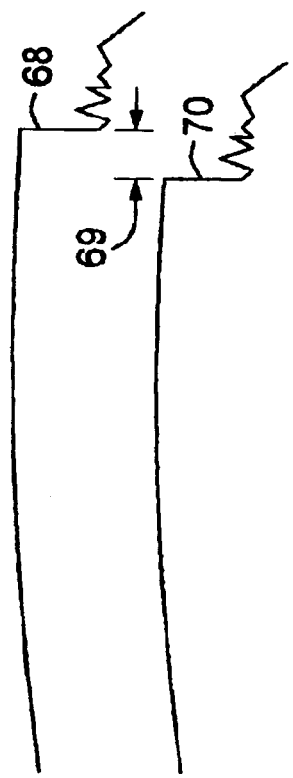

FIGS. 5A, 5B and 5C show timing differences, based on the locations of the fault on the transmission line under test. In FIG. 5A the transient wave has passed the first invention transmitter/receiver (62) and the second transmitter/receiver (64) at exactly the same time. There is no time difference (63) between the two events. This means the fault wave has traveled exactly the same physical distance to both invention transmitter/receivers, therefore the fault is located at a midpoint between the two transmitter/receivers. In FIG. 5B, the fault event wave has passed the first invention transmitter/receiver (65) sooner than the second transmitter/receiver (67) therefore the fault is closer to the first invention transmitter/receiver. There is a time difference between the two events (66), so (a–b) from FIG. 2 would be negative. In FIG. 5C, the fault event wave has passed the second invention transmitter/receiver (70) sooner than the first transmitter/receiver (68) therefore the fault is closer to the second invention transmitter/receiver. There is a time difference between the two events (69), so (a–b) from FIG. 2 would be positive.

Figure 6A:
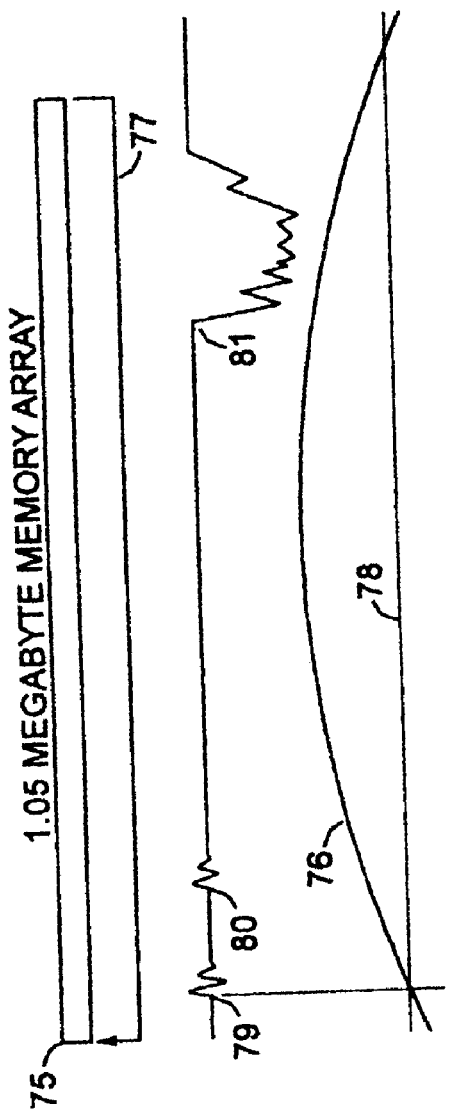
FIGS. 6A and 6B shows two possible examples of configuration of marker and fault memory.
Figure 6B:
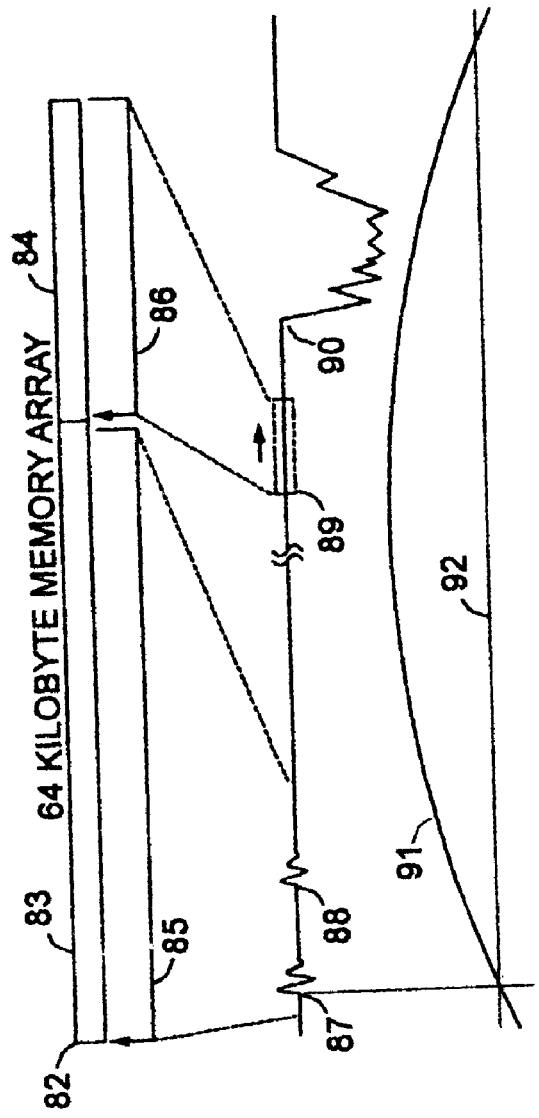

FIGS. 6A and 6B show two possible examples of invention transmitter/receiver memory configuration to collect and store the high frequency burst or marker signal and the transient fault wave. This drawing describes the possible:

memory configuration of a single invention transmitter/receiver, but the description is applicable to any/all invention transmitter/receivers, because they are Identical. The example associated with FIG. 6A In implements a large memory array to store all necessary data and is primarily shown as an illustration of the process, although it is still a possible implementation. The example associated with FIG. 6B implements a much smaller memory array to store all necessary data. This configuration uses the 50 or 60 Hz zero cross and fault wave detection circuitry to control the storage process in such a way that only data necessary to provide distance to fault calculations is stored. Referencing drawing FIG. 6A, a 1.05 megabyte memory array (75) would hold a sufficient number of data points to sample a cycle of 48 Hz power sine wave, worst case, at 10 nanoseconds of resolution, (1/48Hz =20.83 milliseconds per cycle/2=10.42 milliseconds per cycle), Ten nanoseconds of timing resolution would give approximately +/−6 feet of distance accuracy and the analog to digital converter would have 8 bits of vertical resolution. As described in previous descriptions and figures, the power signal (76) crosses zero volts (78) and triggers the invention transmitter/receiver to generate and store a high frequency burst or marker signal (79). The transmitter/receivers deployed on the power distribution network exchange and store each others marker signal, where (79) is the marker generated by the first transmitter/receiver and (80) is the marker received from the second transmitter/receiver. Note the data has been conditioned by a band pass filter or DSP system, as shown in FIG. 3 (19) and/or (26), which removes the low frequency power signal from the acquired data. The transmitter/receiver continues to store high frequency data versus time. If a fault does not occur, the system restarts (77) the process slightly before the next zero and overwrites data in the memory. If a fault (81) does occur, it is stored in memory, along with the marker signal exchange, and the process stops writing to this memory array, thereby retaining a record versus time, of both the marker signals and the fault transient wave. Referencing FIG. 6B, a much smaller memory array can be used (82) if only the data that is critical to the fault location process was stored, specifically the marker signal exchange, the fault transient wave and the length of time between these two events. After the invention transmitter/receivers are deployed and initialized, they begin acquiring and storing high frequency data from the transmission line under test. This data initially is stored in one section (83) of the data array (82), which loops continuously (85) until a power signal (91) zero cross (92) is detected. The zero crossing (92) triggers the invention transmitter/receiver to generate and store a high frequency burst or marker signal (87). The transmitter/receivers deployed on the power distribution network exchange and store each others marker signal, where (87) is the marker signal generated by transmitter/receiver 1, and (88) Is the marker signal received from transmitter/receiver 12. Note the data has been conditioned by a band pass filter or DSP system, as shown in FIG. 3 (19) and (26), which removes the low frequency power signal from the acquired data. The transmitter/receiver stores high frequency data in array (83) for a fixed period before and after zero cross, to insure some data is stored from before the zero cross event and the complete marker signal exchange is stored for a longer length of distribution cable. After the marker exchange has been stored, the system jumps to the start of array (84) and continues to store high frequency data versus time and looping continuously (86). This process effectively creates a window (89) or snapshot of stored data moving along the power signal. The number of loops is also counted to retain time coherence between the marker signals stored data and the fault signals stored data. If a fault does not occur, the system restarts the process slightly before the next zero and overwrites data in the memory as per the process above. If a fault does occur (90), it is stored in the fault memory (84) and the process exits the loop and stops writing to this memory array, thereby retaining a record versus time of both the marker signals and the fault transient wave.

Figure 7A:
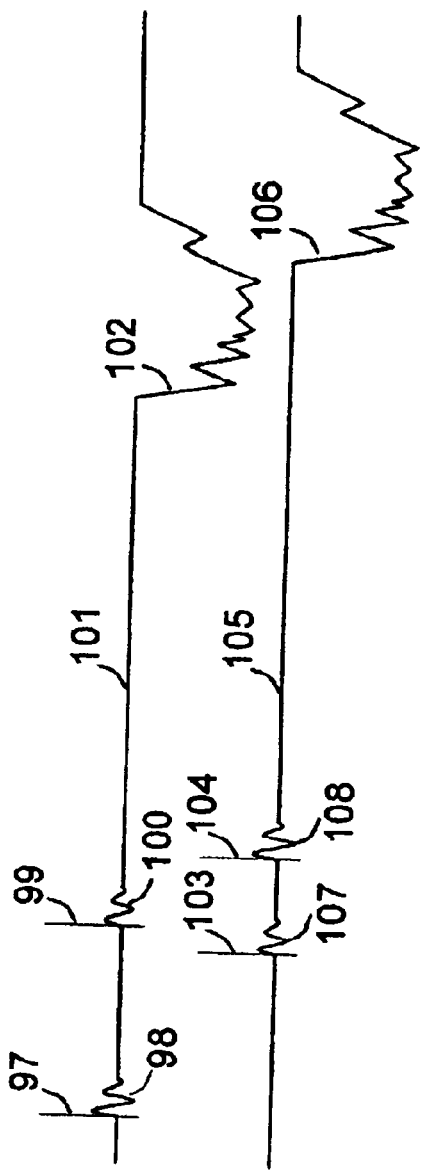
FIGS. 7A and 7B demonstrates aligning data collected by the invention transmitter/receivers.
Figure 7B:
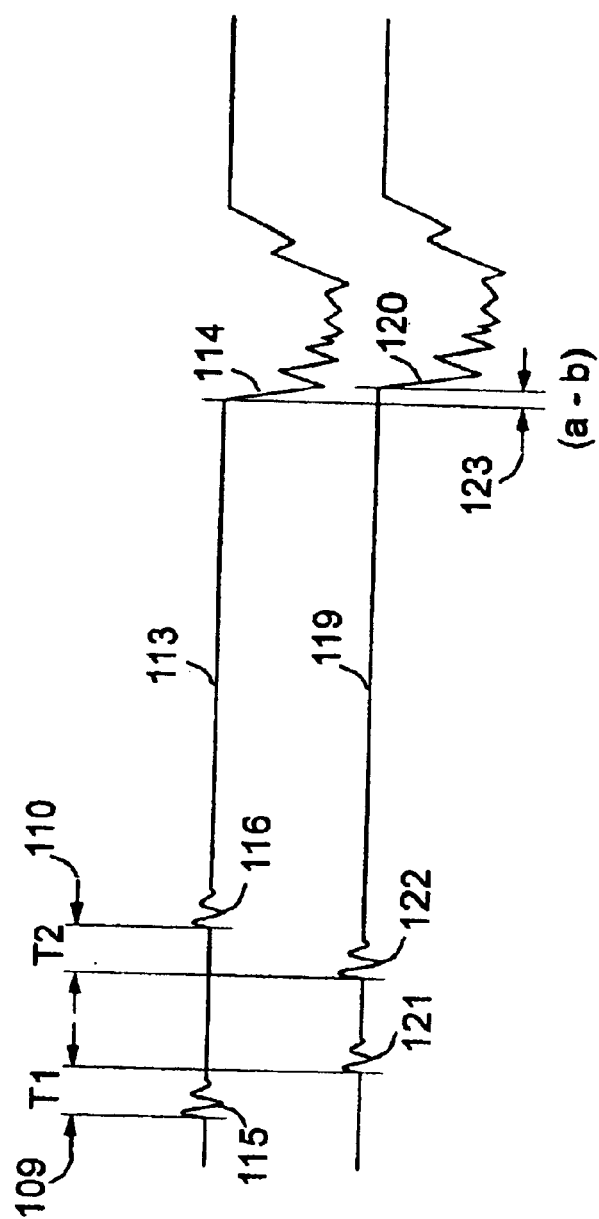

FIGS. 7A and 7B demonstrate aligning data collected by the inventions transmitter/receivers in time. By plotting the marker and fault data arrays from each transmitter/receiver and aligning the time delays associated with marker signal exchange, i.e., making T1 equal to T2, and evaluating the relative time delays associated with the fault wave passing each transmitter/receiver, fault wave time delay differences may be converted to distance relative to the distance separating the invention transmitter/receivers. FIG. 7A, this drawing shows raw data (101) (105) collected from two invention transmitter/receivers, plotted on a common x-axis. Note both transmitter/receivers have exchanged high frequency bursts or marker signals, where (98) is the transmitted marker from the first transmitter/receiver, (107) is the first transmitter/receiver marker received at second transmitter/receiver (108), is the second transmitted marker from transmitter/receiver and (IGO) is second the transmitter/receiver marker received at first transmitter/receiver (107). Reference lines or cursors (97) (99) (103) (104) are then placed at the leading edge of each marker signal. FIG. 7B shows the data from the independent inventions transmitter/receivers (113) (119) have been aligned in time. Considering the high frequency bursts or marker signals (115) (116) (121) (122) have been exchanged by the two transmitter/receivers, over the same transmission line, and since the marker signals are the same frequency and essentially the same signal, it can be assumed the electrical delay from the first transmitter/receiver to the second transmitter/receiver or T1 (109), and from the second transmitter/receiver to first transmitter/receiver or T2 (110), are the same. If the data from one of the invention transmitter/receivers is moved in time until T1 (109) is equal to T2 (110), then the difference between when the fault signal arrived at the first transmitter/receiver (114), and second transmitter/receiver (0.120) (123), now becomes meaningful. This is referred to as (a–b). If the distance separating the invention transmitter/receivers, T1 or T2 and the time difference (a–b) are applied to a simple algebraic formula, a distance for fault relative from either invention the first or second transmitter/receiver location can be derived.

Figure 8:
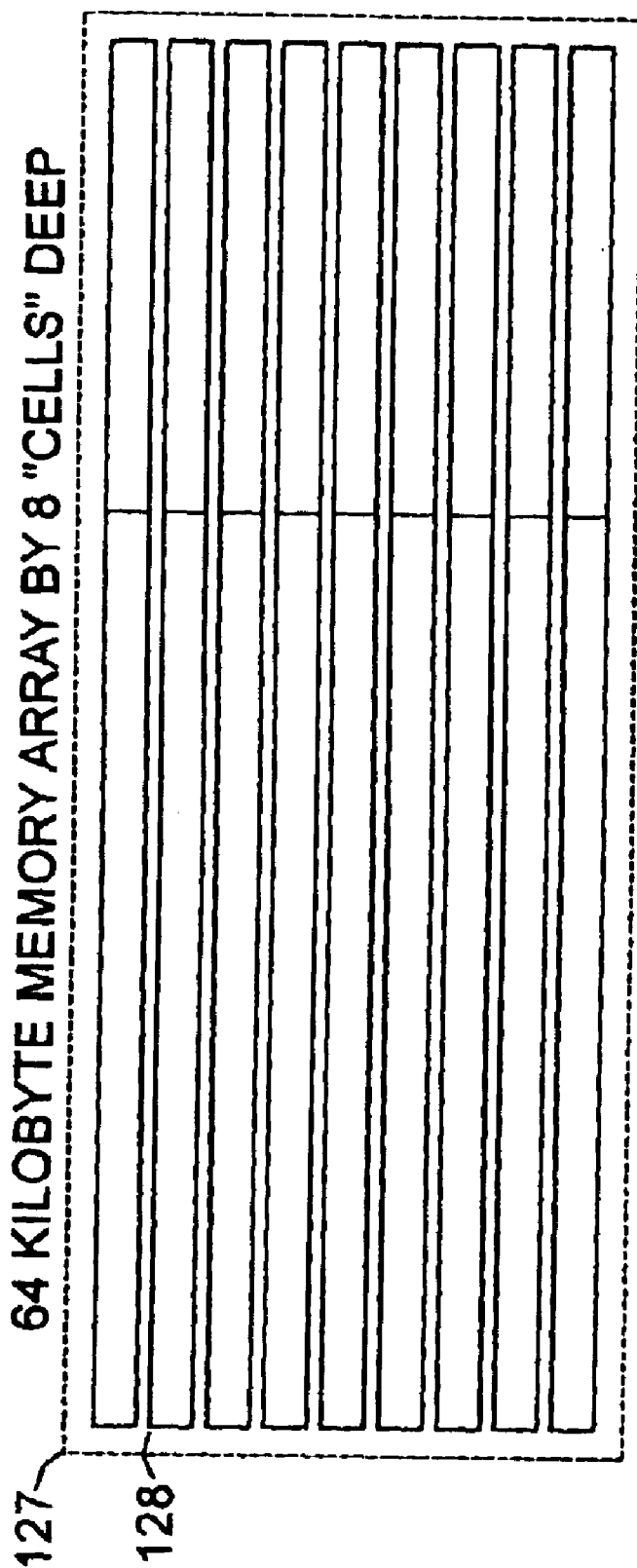
FIG. 8 shows how the memory can store multiple Waveforms to store multiple fault events.

FIG. 8 demonstrates how a large memory array (127) can be used to store multiple waveforms which document multiple fault events over a long monitoring period of time. In FIG. 8, individual memory cells (128) would be used to store individual fault events. When a fault has been detected and stored, the invention transmitter/receiver increments to the next cell and continue monitoring for additional faults.

Figure 9:
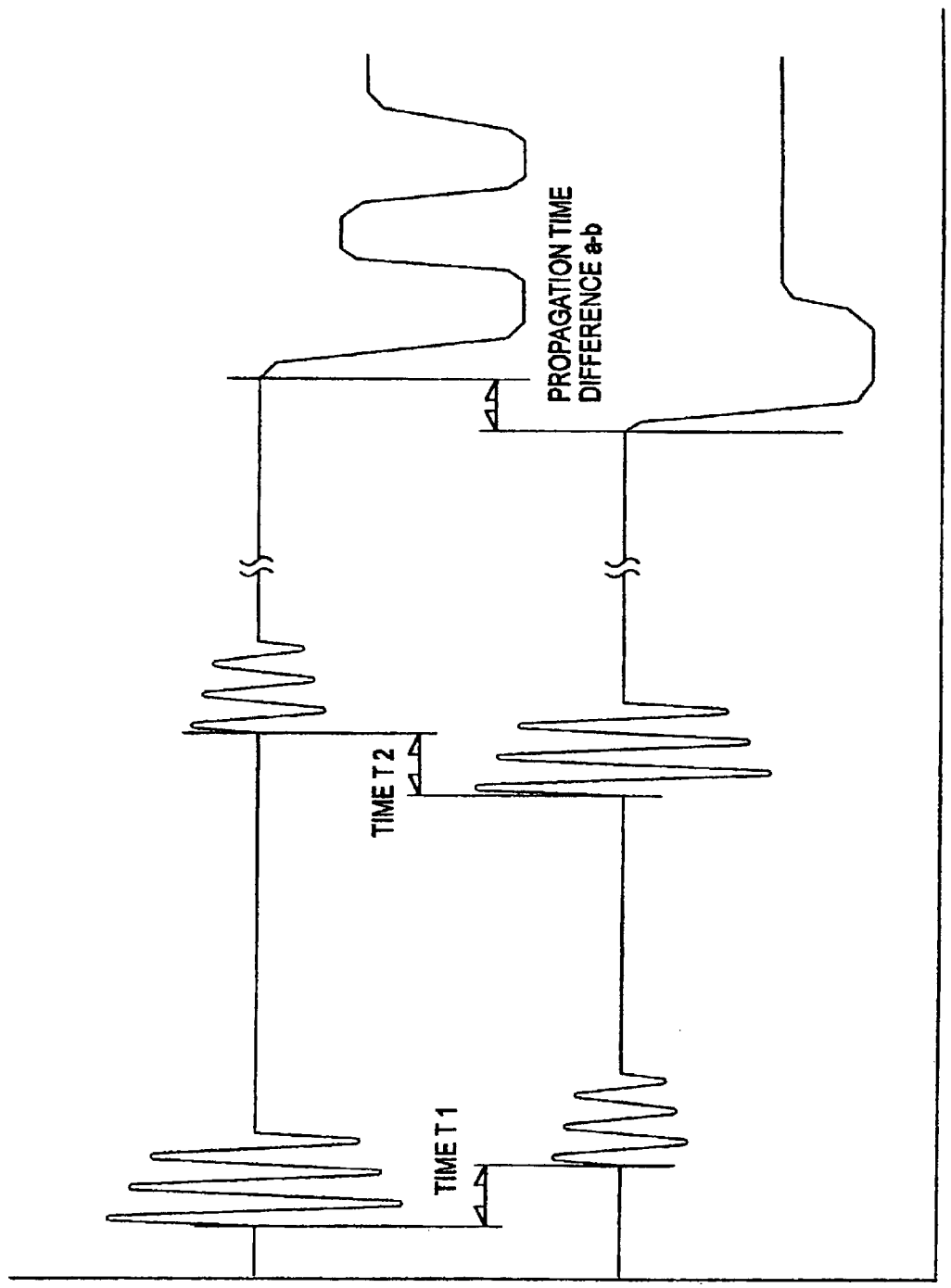
FIG. 9 is an example of how the acquired waveforms might look using a personal computer as the display/analysis method.

FIG. 9 is an example of how the acquired waveforms might look using a personal computer as the display/analysis method.

It is to be understood that the terminology transmitter/receiver is to be interpreted sufficiently broad to include a dedicated receiver where functionally appropriate.

Having hereby disclosed the subject matter of the present invention, it should be obvious that many modifications, substitutions, and variations of the present invention are possible in view of the teachings. It is therefore to be understood that the invention may be practiced other than as specifically described, and should be limited in its breadth and scope only by the claims.

We claim:

1. A method of determining the location of a fault on a signal and/or electrical energy transmission line, comprising the steps of:

a) providing an electrical signal and/or energy transmission line and functionally implementing at least first and second transmitter/receiver means for producing and receiving bursts of high frequency signal thereupon, said first and second transmitter/receiver means being separated from one another by a known spatial distance along said electrical signal and/or energy transmission line;

b) providing a means for storing high frequency signal data transmitted and received by each of said first and second transmitter/receiver means, as a function of time;

said method further comprising repeating step c until an unexpected burst of high frequency signal not transmitted by either of said first and second transmitter/receiver means, is received by both said first and second transmitter/receiver means, said step c being:

c) while storing high frequency signal data which documents the transmission and receipt of high frequency signals sent and received by both said first and second transmitter/receiver means:

upon receipt of a re-occurring initiating event detected by said first transmitter/receiver means causing said first transmitter/receiver means to generate and transmit a burst of high frequency signal which propagates toward said second transmitter/receiver means, said burst of high frequency signal being received by said second transmitter/receiver means; and at least one selection from the group consisting of:

upon receipt of said re-occurring initiating event detected by said second transmitter/receiver means, causing said second transmitter/receiver means to generate and transmit a burst of high frequency signal which propagates toward said first transmitter/receiver means, said burst of high frequency signal being by said first transmitter/receiver means; and after detection of a signal from the first transmitter/receiver means, causing said second transmitter/receiver means to generate and transmit a burst of high frequency signal which propagates toward said first transmitter/receiver means, said burst of high frequency signal being received by said first transmitter/receiver means;

d) said method further comprising, upon the detection and storage of an unexpected burst of high frequency signal by, not generated by either said first or second transmitter/receiver means, causing at last transmitted and received high frequency signal date generated in step c which corresponds to the last occurrence of the re-occuring initiating event, and data which documents the unexpected high frequency signal to be fixed in said means for storing high frequency data as functions of time;

e) by utilizing data stored in said means for storing high frequency signal data, developing and aligning first and second effective high frequency data plots time which correspond to signals received by said first and second transmitter/receiver means respectively, so that:

a difference in time between the initiation of the burst of high frequency signal provided by the first transmitter/receiver means In said first effective high frequency data plot vs time, and the receipt of said burst of high frequency signal by said second transmitter/receiver means in said second effective high frequency data plot vs time;

is caused to be equal to:

a difference in time between the initiation of the burst of high frequency signal provided by the second transmitter/receiver means in said second effective high frequency data plot vs time and receipt of said burst of high frequency signal by said first transmitter/receiver means in said first effective high frequency data plot vs time;

said effective data plots including data corresponding to detection of said unexpected burst of high frequency signal not generated by either said first or second transmitter/receiver means;

f) measuring a resulting time difference in said first and second aligned effective plots vs. time between corresponding analogous points in unexpected high frequency signal detected by said first transmitter/receiver means and said second transmitter/receiver means; and g) converting said time difference determined In step f, into a spatial distance of location of said signal and/or electrical energy transmission fault located between said first and second transmitter/receiver means.

2. A method of determining the location of a fault on a signal and/or electrical energy transmission line as in claim 1, in which the signal and/or electrical energy transmission line is a 50 or 60 Hz AC electrical power transmission line and in which said re-occuring initiating event which is utilized to cause said first transmitter/receiver means to generate and transmit a burst of high frequency signal is a voltage and/or current zero crossing which arrives at said first and second transmitter/receiver means at times offset from one another by the time of propagation of said zero crossing between said first and second transmitter/receiver means based on the velocity of propagation thereof along said 50 or 60 Hz AC electrical power transmission line.

3. A method of determining the location of a fault on a signal and/or electrical energy transmission line as in claim 2, in which the initiating signal voltage and/or current zero crossing is utilized to cause said second transmitter/receiver means to generate and transmit a burst of high frequency signal and wherein said signal voltage and/or current zero crossing propagates from said first to second transmitter/receiver at a slower velocity of propagation than does the burst of high frequency signal transmitted from said first transmitter/receiver means and received by said second transmitted/received means or from said second transmitted/received means to first transmitted/received means.

4. A method of determining the location of a fault on a signal and/or electrical energy transmission line as in claim 1, in which the initiating signal received by the second transmitter/receiver is generated by the first transmitter/receiver.

5. A method of determining the location of a fault on a signal and/or electrical energy transmission line as in claim 1, in which there is no time difference in said aligned effective plots vs. time, between analogous points in the detection of the unexpected high frequency signal or fault by said first transmitter/receiver means and said second transmitter/receiver means, and the fault on said signal and/or electrical energy transmission line is located substantially half way between said first and second transmitter/receiver means.

6. A method of determining the location of a fault on a signal and/or electrical energy transmission line as in claim 1, in which there is a time difference in said aligned effective plots vs. time, between analogous points in the detection of the unexpected high frequency signal or fault by said first transmitter/receiver means and said second transmitter/receiver means, and the fault on said signal and/or electrical energy transmission line is located at a selection from the group consisting of:

being closer to said first transmitter/receiver means; and being closer to said second transmitter/receiver means.

7. A method of determining the location of a fault on signal and/or electrical energy transmission line as in claim 1, in which the terminology high frequency includes frequencies above 1,000 Hz.

8. A method for determining the location of a fault on a signal and/or electrical energy transmission line as in claim 7, in which the frequency of the unexpected high frequency signal is on the order of 1 MHz and that of the high frequency bursts transmitted by said first and second transmitted/received means is on the order of 300–500 KHz.

9. A method of determining a location of a fault on a signal and/or electrical energy transmission line as in claim 8, in which the signal and/or electrical energy transmission line is a three-phase power transmission system.

10. A method of determining a location of a fault on a signal and/or electrical energy transmission line as in claim 8, in which the signal and/or electrical energy transmission line is a power transmission system using an AC power wave that is low enough in frequency such that its velocity of propagation is slow enough so as to allow the markers to propagate faster than the AC power wave does.

11. A method of determining a location of a fault on a signal, and/or electrical energy transmission line as in claim 8, in which the signal and/or electrical energy transmission line is such that the invention transmitter/receivers can randomly trigger each other so as to exchange marker signals. The randomly timed triggering events are of sufficient low frequency so that the marker signals have time to traverse reasonable lengths of cable under test, as required by the application and not be mixed with each others markers.

12. A method of determining a location of a fault on a signal and/or electrical energy transmission line as in claim 8, in which the signal and/or electrical energy transmission line is a single-phase power transmission system.

13. A method of determining a location of a fault on a signal and/or electrical energy transmission line as in claim 8, in which the signal and/or electrical energy transmission line is an aircraft power transmission system.

14. A method of determining a location of a fault on a signal and/or electrical energy transmission line as in claim 8, in which the signal and/or electrical energy transmission line is a spacecraft power transmission system.

15. A method of determining a location of a fault on a signal and/or electrical energy transmission line as in claim 8, in which the signal and/or electrical energy transmission line is a commercial or naval ship power transmission system.

16. A method of determining a location of a fault on a signal and/or electrical energy transmission line as in claim 8, in which the signal and/or electrical energy transmission line is a localized industrial power transmission system.

17. A method of determining the location of a fault on a signal and/or electrical energy transmission line as in claim 1, in which the frequency content of the high frequency bursts transmitted by said first and second transmitter/receiver means is selected to approximate the frequency content of said unexpected high frequency signal resulting from a fault on the electrical signal and/or energy transmission line so as to provide substantially similar velocity of propagation.

18. A method of determining the location of a fault on a signal and/or electrical energy transmission line as in claim 1, in which there are more than two transmitter/receiver means.

19. A method of determining the location of a fault on a signal and/or electrical energy transmission line as in claim 1, in which said means for storing high frequency signal data transmitted and received by each of said first and second transmitter/receiver means, as a function of time is configured in such a manner to allow storing data corresponding to multiple fault events.

20. A method of determining the location of a fault on a signal and/or electrical energy transmission line as in claim 1, in which the electrical signal and/or energy transmission line comprises at least two conductors.

21. A method of determining the location of a fault on a signal and/or electrical energy transmission line, comprising the steps of:

a) providing an electrical signal and/or energy transmission line and functionally implementing thereupon first and second transmitter/receiver means for producing and optionally receiving bursts of high frequency signal, and a receiver means for receiving bursts of high frequency signal, said first and second transmitter/receiver meant each being separated from said receiver means which is present therebetween by a known spatial distance along said electrical signal and/or energy transmission line;

b) providing a means for storing high frequency signal data transmitted and received by each of said first and second transmitter/receiver means, as a function of time;

said method further comprising repeating step c until an unexpected burst of high frequency signal not transmitted by either of said first and second transmitter/receiver means, is received by both said first and second transmitter/receiver means and said receive means, said step c being:

c) while storing high frequency signal data which documents the transmission and receipt of high frequency signals sent by both said first and second transmitter/receiver means and received by said receiver means:

causing said first transmitter means to generate and transmit a burst of high frequency signal which propagates toward said receiver means; and causing said second transmitter means to generate and transmit a burst of high frequency signal which propagates toward said receiver means; and d) said method further comprising, upon the detection of an unexpected burst of high frequency signal by said first or second transmitter/receiver means and/or receiver means, but not generated by either said first or second transmitter/receiver means, causing at least transmitted and received high frequency signal data generated in step c which corresponds to the last occurrence of the re-occuring initiating event, and data which documents the unexpected high frequency signal to be fixed in said means for storing high frequency data as functions of time;

e) by utilizing data stored in said means for storing high frequency signal data, developing and aligning first and second effective high frequency data plots vs time which correspond to signals received by said first and second transmitter/receiver means to receiver means respectively, so that:

a difference in time between the initiation of the burst of high frequency signal provided by the first transmitter/receiver means in said first effective high frequency data plot vs time, and the receipt of said burst of high frequency signal by said receiver means in said second effective high frequency data plot vs time;

is caused to be equal to:

a difference in time between the initiation of the burst of high frequency signal provided by the second transmitter/receiver means in said second effective high frequency data plot vs time and receipt of said burst of high frequency signal by said receiver means in said first effective high frequency data plot vs time;

said effective data plots including data corresponding to detection of said unexpected burst of high frequency signal not generated by either said first or second transmitter/receiver means;

f) measuring a resulting time difference in said first and second aligned effective plots vs. time between corresponding analogous points in unexpected high frequency signal detected by said receiver means; and g) converting said time difference determined in steps f into a spatial distance of location of said unexpected high frequency signal between said first and second transmitter/receiver means.

22. A method as in claim 21 in which the step c causing of said first transmitter means to generate and transmit a burst of high frequency signal is based upon:

receipt thereby of a re-occuring initiating event; and in which the step c causing of said second transmitter means to generate and transmit a burst of high frequency signal is based upon a selection from the group consisting of:

receipt thereby of a re-occuring initiating event; and a signal from the first transmitter/receiver means; by said receiver means.

23. A method of determining the location of a fault on a signal and/or electrical energy transmission line, comprising the steps of:

a) providing an electrical signal and/or energy transmission line and functionally implementing at least first and second transmitter means for producing bursts of high frequency signal thereupon and a receiver means for receiving bursts of high frequency signal, said first and second transmitter means being separated from one another by a known spatial distance along said electrical signal or energy transmission line, and said separate receiver means being placed midway therebetween;

b) providing a means for storing high frequency signal data transmitted by each of said first and second transmitter means and received by said receiver means, as a function of time;

said method further comprising repeating step c until an unexpected burst of high frequency signal not transmitted by either of said first and second transmitter means, is received by receiver means, said step c being:

c) while storing high frequency signal data which documents the transmission of high frequency signals sent by both said first and second transmitter means and receipt thereof by said receiver means, in any functional order:

causing said first transmitter means to generate and transmit a burst of high frequency signal which propagates toward said receiver means; and causing said second transmitter means to generate and transmit a burst of high frequency signal which propagates toward said receiver means; and d) said method further comprising, upon the detection of an unexpected burst of high frequency signal by said receiver means, causing said unexpected burst of high frequency signal and high frequency signal data generated in step c which corresponds to at least the last occurrence of the first and second transmitter generated bursts of high frequency signal, to be fixed in said means for storing high frequency data as functions of time;

e) by utilizing data stored in said means for storing high frequency signal data as a function of time received by said receiver means from said first and second transmitters respectively, developing and aligning first and second effective high frequency data plots vs time so that:

a difference in time between the initiation of the burst of high frequency signal provided by the first transmitter means in said first effective high frequency data plot vs time, and the receipt of said burst of high frequency signal by said receiver means in said second effective high frequency data plot vs time;

is caused to be equal to:

a difference in time between the initiation of the burst of high frequency signal provided by the second transmitter means in said second effective high frequency data plot vs time, and the receipt of said burst of high frequency signal by said receiver means in said first effective high frequency data plot vs time;

said effective data plots including data corresponding to the detection of said unexpected burst of high frequency signal not generated by either said first or second transmitter means;

f) measuring a resulting time difference in said first and second aligned effective plots vs. time between corresponding analogous points in unexpected high frequency signal detected by said receiver means; and g) converting said time difference determined in step f into a spatial distance of location of said expected burst of high frequency signal between said first and second transmitter means.

24. A method as in claim 23 in which the step c causing of said first transmitter means to generate and transmit a burst of high frequency signal is based upon:

receipt thereby of a re-occuring initiating event; and in which the step c causing of said second transmitter means to generate and transmit a burst of high frequency signal is based upon a selection from the group consisting of:

receipt thereby of a re-occuring initiating event; and a signal from the first transmitter/receiver means; by said receiver means.

25. A method of determining the location of a fault on a signal and/or electrical energy transmission line, comprising the steps of:

a) providing an electrical signal and/or energy transmission line and functionally implementing at least first and second transmitter/receiver means for producing and receiving bursts of high frequency signal thereupon, said first and second transmitter/receiver means being separated from one another by a known spatial distance along said electrical signal and/or energy transmission line;

b) providing a means for storing high frequency signal data transmitted and received by each of said first and second transmitter/receiver means, as a function of time;

said method further comprising repeating step c until an unexpected burst of high frequency signal not transmitted by either of said first and second transmitter/receiver means, is received by both said first and second transmitter/receiver means, said step c being:

c) while storing high frequency signal data which documents the transmission and receipt of high frequency signals sent and received by both said first and second transmitter/receiver means, in any functional order:

causing said first transmitter/receiver means to generate and transmit a burst of high frequency signal which propagates toward said second transmitter/receiver means, said burst of high frequency signal being received by said second transmitter/receiver means; and causing said second transmitter/receiver means to generate and transmit a burst of high frequency signal which propagates toward said first transmitter/receiver means, said burst of high frequency signal being received by said first transmitter/receiver means; and d) said method further comprising, upon the detection of an unexpected burst of high frequency signal by, not generated by either said first or second transmitter/receiver means, causing at least transmitted and received high frequency signal data generated in step c which corresponds to the last occurrence of the transmission by each of said first and second transmitter/receiver means, and data which documents the unexpected high frequency signal to be fixed in said means for storing high frequency data as functions of time;

e) by utilizing data stored in said means for storing high frequency signal data as functions of time, developing and aligning first and second effective high frequency data plots vs time which correspond to signals received by said said first and second transmitter/receiver means respectively, so that:

a difference in time between the initiation of the burst of high frequency signal provided by the first transmitter/receiver means in said first effective high frequency data plot vs time, and the receipt of said burst of high frequency signal by said second transmitter/receiver means in said second effective high frequency data plot vs time;

is caused to be equal to:

a difference in time between the initiation of the burst of high frequency signal provided by the second transmitter/receiver means in said second effective high frequency data plot vs time and receipt of said burst of high frequency signal by said first transmitter/receiver means in said first effective high frequency data plot vs time;

said effective data plots including data corresponding to detection of said unexpected burst of high frequency signal not generated by either said first or second transmitter/receiver means;

f) measuring a resulting time difference in said first and second aligned effective plots vs. time between corresponding analogous points in unexpected high frequency signal detected by said first transmitter/receiver means and said second transmitter/receiver means; and g) converting said time difference In time determined in step f Into a spatial distance of location of the source of the unexpected high frequency signal located between said first and second transmitter/receiver means.

26. A method as in claim 25 in which the step c causing of said first transmitter/receiver means to generate and transmit a burst of high frequency signal is based upon:

receipt thereby of a re-occuring initiating event; and in which the step c causing of said second transmitter/receiver means to generate and transmit a burst of high frequency signal is based upon a selection from the group consisting of: receipt thereby of a re-occuring initiating event; and a signal from the first transmitter/receiver means by said receiver means.

27. A method of determining the velocity of propagation of high frequency signals on a signal and/or electrical energy transmission line, comprising the steps of:

a) providing an electrical signal and/or energy transmission line and functionally implementing at least first and second transmitter/receiver means for producing bursts of high frequency signal thereupon and a receiver means for receiving bursts of high frequency signal, said first and second transmitter/receiver means being separated from one another by a known spatial distance along said electrical signal or energy transmission line, and said separate receiver means being placed midway therebetween;

b) providing a means for storing high frequency signal data transmitted by each of said first and second transmitter/receiver means and received by said receiver means, as a function of time;

said method further comprising repeating step c until an unexpected burst of high frequency signal not transmitted by either of said first and second transmitter/receiver means, is received by receiver means, said step c being:

c) while storing high frequency signal data which documents the transmission of high frequency signals sent by both said first and second transmitter/receiver means and receipt thereof by said receiver means, in any functional order:

causing said first transmitter/receiver means to generate and transmit a burst of high frequency signal which propagates toward said receiver means; and causing said second transmitter/receiver means to generate and transmit a burst of high frequency signal which propagates toward said receiver means; and d) by utilizing data stored in said means for storing high frequency signal data as a function of time received by said receiver means from said first and second transmitter/receivers respectively, developing and aligning first and second effective high frequency data plots vs time so that:

a difference in time between the initiation of the burst of high frequency signal provided by the first transmitter/receiver means in said first effective high frequency data plot vs time, and the receipt of said burst of high frequency signal by said receiver means in said second effective high frequency data plot vs time;

is caused to be equal to:

a difference in time between the Initiation of the burst of high frequency signal provided by the second transmitter/receiver means in said second effective high frequency data plot vs time, and the receipt of said burst of high frequency signal by said receiver means in said first effective high frequency data plot vs time;

dividing the known spatial separation of the first and second transmitter/receiver means by the time difference determined in step d.

28. A method of determining the velocity of propagation of high frequency signals on a signal and/or electrical energy transmission line, comprising the steps of:

a providing an electrical signal and/or energy transmission line and functionally implementing at least first and second transmitter means for producing bursts of high frequency signal thereupon and a receiver means for receiving bursts of high frequency signal, said first and second transmitter means being separated from one another by a known spatial distance along said electrical signal or energy transmission line, and said separate receiver means being placed midway therebetween;

b) providing a means for storing high frequency signal data transmitted by each of said first and second transmitter means and received by said receiver means, as a function of time;

c) while storing high frequency signal data which documents the transmission of high frequency signals sent by both said first and second transmitter means and receipt there of by said receiver means, in any functional order:
   causing said first transmitter means to generate and transmit a burst of high frequency signal which propagates toward said receiver means; and
   causing said second transmitter means to generate and transmit a burst of high frequency signal which propagates toward said receiver means; and d) by utilizing data stored in said means for storing high frequency signal data as a function of time received by said receiver means from said first and second transmitters respectively, developing and aligning first and second effective high frequency data plots vs time so that:
   a difference in time between the initiation of the burst of high frequency signal provided by the first transmitter means in said first effective high frequency data plot vs time, and the receipt of said burst of high frequency signal by said receiver means in said second effective high frequency data plot vs time;
is caused to be equal to:
   a difference in time between the initiation of the burst of high frequency signal provided by the second transmitter means in said second effective high frequency data plot vs time, and the receipt of said burst of high frequency signal by said receiver means in said first effective high frequency data plot vs time; dividing the known spatial separation of the first and second transmitter means to the receive means by the time difference determined in step d.

* * * * *